(12) United States Patent
Yamanaka et al.

(10) Patent No.: US 6,218,482 B1
(45) Date of Patent: Apr. 17, 2001

(54) EPOXY RESIN, PROCESS FOR PREPARING THE RESIN AND PHOTO-CURABLE RESIN COMPOSITION AND RESIN COMPOSITION FOR POWDER COATINGS CONTAINING THE EPOXY RESIN

(75) Inventors: Masahiko Yamanaka, Koka-gun; Harutomo Nomoto, Uji; Tomio Nobe, Yawata; Shigeo Takatsuji, Otsu, all of (JP)

(73) Assignee: New Japan Chemical Co., Ltd. (JP)

( * ) Notice: Subject to any disclaimer, the term of this patent is extended or adjusted under 35 U.S.C. 154(b) by 0 days.

(21) Appl. No.: 09/004,907

(22) Filed: Jan. 9, 1998

Related U.S. Application Data

(63) Continuation of application No. 08/532,757, filed as application No. PCT/JP95/00239 on Feb. 20, 1995.

(30) Foreign Application Priority Data

Feb. 24, 1994 (JP) .................................................. 53116/1994
Nov. 10, 1994 (JP) ............................................ 276328/1994
Dec. 12, 1994 (JP) ............................................ 307767/1994

(51) Int. Cl.[7] .............................. C08F 2/48; C08L 63/02; C08G 59/04; C08G 59/06
(52) U.S. Cl. ........................ 525/524; 525/523; 525/481; 522/31; 522/146; 522/166
(58) Field of Search .................................... 525/523, 524; 522/146, 166, 31; 528/405, 406, 421

(56) References Cited

U.S. PATENT DOCUMENTS

| | | | |
|---|---|---|---|
| 3,878,132 | 4/1975 | Bertram | 260/2 EP |
| 4,623,701 | 11/1986 | Massingill | 525/524 |
| 4,857,562 | 8/1989 | Wacker et al. | |
| 4,908,423 | 3/1990 | Roth et al. | 528/97 |
| 5,106,947 | 4/1992 | Maurer et al. | 528/361 |
| 5,292,832 | 3/1994 | Hickner | 525/524 |
| 5,393,805 | 2/1995 | Koyama et al. | 523/400 |
| 5,741,835 | 4/1998 | Stark | 523/403 |

FOREIGN PATENT DOCUMENTS

| | | |
|---|---|---|
| 365428 | 4/1990 | (EP) . |
| 50-153097 | 12/1975 | (JP) . |
| 58-198532 | 11/1983 | (JP) . |
| 63-248825 | 10/1988 | (JP) . |
| 1-126638 | 5/1989 | (JP) . |
| 2-191680 | 7/1990 | (JP) . |
| 4-314721 | 11/1992 | (JP) . |

Primary Examiner—Susan W. Berman
(74) Attorney, Agent, or Firm—Larson & Taylor, PLC

(57) ABSTRACT

An epoxy resin containing group(s) of formula (1) and having a number average molecular weight of 400–10,000, an epoxy equivalent of 100–5,000 and an average number of glycidyl ether groups per molecule of 2–50

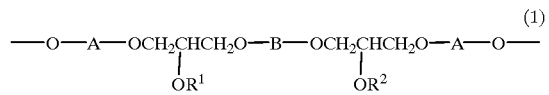

wherein A is a group

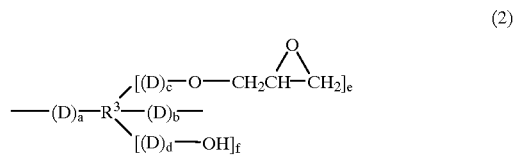

(wherein $R^3$ is a saturated aliphatic polyhydric alcohol residue having 2 to 30 carbon atoms, D is oxyalkylene group, a, b, c and d are 0–25, e and f are 0–4, e+f equals 0–4 and a+b+c×e+d×f equals 0–50), and B is

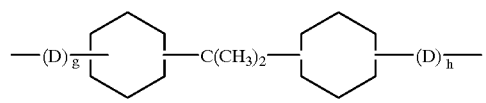

(g, h are 0–18), etc. and $R^1$ and $R^2$ are H, glycidyl or a group of the formula

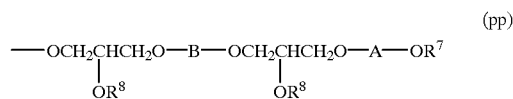

wherein A and B are as defined above, and $R^7$, $R^8$ and $R^9$ are H or glycidyl group; its preparation, and photo-curable and powder coating resin compositions containing the same.

19 Claims, No Drawings

EPOXY RESIN, PROCESS FOR PREPARING THE RESIN AND PHOTO-CURABLE RESIN COMPOSITION AND RESIN COMPOSITION FOR POWDER COATINGS CONTAINING THE EPOXY RESIN

This is a continuation of application Ser. No. 08/532,757 filed Oct. 11, 1995, now abandoned; which is a 371 of PCT/JP95/00239 filed Feb. 20, 1995.

FIELD OF THE INVENTION

This invention relates to an epoxy resin and a process for the preparation thereof, as well as a photo-curable resin composition and a resin composition for powder coatings, both containing said resin.

The epoxy resin of the invention is excellent in weatherability and is useful for paints, molding materials, encapsulants, etc.

The photo-curable composition of the invention has an excellent weatherability, and is useful for paints, coating materials, inks, molding materials, encapsulants, etc.

The resin composition for powder coatings according to the invention gives coating films having excellent weatherability and is useful for coating construction materials, traffic-related articles, vehicle-related articles, steel furniture and light electrical appliances, etc. which are exposed to ultraviolet rays such as outdoor light rays and the like.

BACKGROUND ART (I) Conventionally, bisphenol-based epoxy resins have been widely used in the fields of paints, electrical art, civil engineering and construction, adhesives and the like, because of their excellent adhesive power, resistance to chemicals, electrical characteristics and toughness. Especially, with respect to the use for cationic electrophoretic coating compositions, powder coating compositions, solvent-based epoxy resin coating compositions, etc., bisphenol A-based high molecular weight epoxy resins having a molecular weight of 900 to 2000 are used. However, such bisphenol-based epoxy resins are poor in weatherability because they have benzene rings as contained in the skeleton.

As high molecular weight epoxy resins containing no benzene ring, known are those prepared by converting an alicyclic epoxy compound such as diglycidyl ether of hydrogenated bisphenol A or 3,4'-epoxycyclohexylmethyl-3',4'-epoxycyclohexane carboxylate to a high molecular weight resin by means of a polycarboxylic acid. However, these epoxy resins contain ester linkages and therefore are susceptible to hydrolysis and unsatisfactory in weatherability.

As described above, the epoxy resins as materials for said various uses remain to be improved, but high molecular weight epoxy resins containing no benzene ring and ester linkage are not known so far.

(II) Epoxy resins also have been conventionally employed in combination with a cationic photoinitiator for use as a photo-curable resin composition.

Conventionally, acrylic resins are known as photo-curable resins but reportedly have the problems that, since said resin cures by radical polymerization reaction, the polymerization thereof is partly inhibited due to oxygen in the air and they are unsatisfactory in the surface hardening properties, and that acrylic monomers are highly toxic and that said acrylic resin is low in adhesion to metals and plastics.

In recent years, attention is drawn to photo-curable resin compositions comprising a cationically polymerizable substance and a cationic photoinitiator because surface hardening thereof is not hindered by the air and because said compositions have low toxicity, less skin irritation, high adhesion to metals and plastics, etc. Such resin compositions have been already used for coating cans and for coating plastics.

Examples of the cationically polymerizable substances are bisphenol A-based epoxy resins, phenol novolak-based epoxy resins, cresol novolak-based epoxy resins, aliphatic glycidyl ether compounds, alicyclic epoxy resins such as 3,4-epoxycyclohexylmethyl-3',4'-epoxycyclohexanecarboxylate, di(3,4-epoxycyclohexylmethyl)adipate, etc. which are disclosed, e.g. in Japanese Examined Patent Publication (Kokoku) No. 14278/1977 and Japanese Unexamined Patent Publication (Kokai) No. 239402/1993, and vinyl monomers, cyclic ethers, vinyl ethers and other oxirane oxygen-free monomers or their oligomers which are disclosed in Japanese Unexamined Patent Publication No. 32831/1978.

However, said cationically polymerizable substances can not be suited for all applications. For example, aromatic moiety-containing epoxy resins such as bisphenol A-based epoxy resins, phenol novolak-based epoxy resins, cresol novolak-based epoxy resins, etc. have low photo-curing rate, and furthermore the cured product obtained can not be used as coating materials for outdoor applications because of low weatherability. Moreover, it is difficult to photo-cure a thick film of these resins.

Alicyclic epoxy resins such as 3,4-epoxycyclohexylmethyl-3'4'-epoxycyclohexanecarboxylate, di(3,4-epoxycyclohexylmethyl)adipate, etc. have high level of photo-curing rate sufficient for commercial use, and are excellent in weatherability. However, there is a limitation in the commercial availability of these resins, and it is difficult to uniformly cure a thick film thereof. Furthermore, these resins have the drawback of giving coatings which are brittle and low in flexibility, impact resistance and adhesion.

Vinyl ethers have high photo-curing rate, but emit an offensive odor and, when added in a large amount, give coatings which are poor in hardness, flexibility, impact resistance, adhesion, thermal coloring resistance and other properties. The conjoint use of the cationic polymerizable substances can alleviate the drawbacks to some extent but can not be a complete countermeasure at present. These problems are a great obstacle to wider applications of cationic photopolymerizable resins.

Additionally, basic components of the photo-curable resin compositions comprise a cationic polymerizable substance and a cationic photoinitiator, and it is desired to combine the polymerizable substance with the cationic photoinitiator which is excellent in compatibility with the cationic polymerizable substance, in thermal coloring resistance and in weatherability.

Thus, cationic polymerizable substances which are outstanding in weatherability, high in photo-curing rate, uniformly curable throughout a thick coating film and excellent in film properties such as adhesion, flexibility, impact resistance and the like are not known. Also unknown are photo-curable resin compositions containing a cationic photoinitiator which is superior in the compatibility, thermal coloring resistance and weatherability.

(III) Epoxy resins have been used in the field of powder coatings as well.

Generally, powder coatings have the advantages of being excellent in film properties, enabling recovery for reuse, ensuring a high coating efficiency, facilitating automation, etc., and, from a viewpoint of environmental conservation, they have a great advantage of being low-pollutant due to the absence of a solvent.

Mainly used as powder coatings are epoxy-based powder coatings comprising a high molecular weight epoxy resin and a curing agent such as acid anhydrides, amine derivatives, phenolic resins, etc., hybrid powder coatings comprising a carboxyl group-containing polyester resin and a high molecular weight epoxy resin, polyester/TGIC-based powder coatings comprising a carboxyl group-containing polyester resin and triglycidyl isocyanurate (hereinafter referred to as "TGIC"), and polyester/urethane resin-based powder coatings comprising a hydroxyl group-containing polyester resin and a blocked polyisocyanate as a curing agent.

Conventionally, epoxy-based and hybrid powder coatings predominantly contain a high molecular weight bisphenol A type glycidyl ether as the epoxy resin component, and thus have the drawback of having low weatherability. For applications which particularly require weatherability, polyester/TGIC-based and polyester/urethane resin-based powder coatings have been used.

Polyester resins frequently used as the main component of powder coatings are prepared from a polyhydric alcohol and a polycarboxylic acid as the starting materials. A wide variety of polyester resins different in formulation, degree of polymerization, melting point, etc. can be produced by varying the combination of these starting materials, and a proper combination thereof can produce a powder coating well balanced in costs, pigment dispersibility, weatherability, flexibility and adhesion of the coating film.

Polyester/urethane resin-based powder coatings are excellent in film properties such as coating appearance, weatherability, corrosion resistance, etc.

However, these powder coatings contain, as a curing agent, a polyisocyanate whose active sites are blocked with caprolactam or the like, and thus must be cured upon removal of the blocking agent at a high temperature during baking, and at the same time pose the problem of environmental pollution arising from the evaporation of the blocking agent.

On the other hand, polyester/TGIC-based powder coatings essentially do not involve the evaporation of volatile component during baking, are curable at a low temperature and give cured coating films having good appearance and high weatherability, corrosion resistance, chemical resistance, etc. Consequently, these powder coatings have characteristics suitable for coping with environmental problems. However, TGIC has an average molecular weight of as low as about 300 and is inevitably toxic to humans and objectionable for skin irritation, mutagenicity, etc. The toxicity of TGIC used for powder coatings is a problem, and an epoxy compound to be used in place of TGIC should be one having a high molecular weight.

As set forth above, resin compositions for powder coatings which are excellent in film properties and weatherability, free of the evaporation of volatile component during baking and low in toxicity are not known. Consequently, there is a demand for resin compositions for powder coatings which are usable as a substitute for the polyester/TGIC-based powder coatings and which have high weatherability.

DISCLOSURE OF THE INVENTION

Accordingly, an object of the present invention is to provide a novel and useful saturated epoxy resin having an alicyclic skeleton and glycidyl ether groups and containing ether linkages only, and a commercially advantageous process for preparing such epoxy resin.

Another object of the invention is to provide a photo-curable resin composition which is excellent in weatherability, has high photo-curing rate, is uniformly curable throughout a thick coating film, is free of hindrance to surface hardening by oxygen, is excellent in film properties such as adhesion, flexibility, impact resistance, etc. and low in toxicity and skin irritation.

Still another object of the invention is to provide a resin composition for powder coatings which are outstanding in weatherability, free of the evaporation of volatile component during baking, low in toxicity and skin irritation without deteriorating the film properties such as coating appearance, adhesion, strength, impact resistance, water resistance and flexibility.

The present invention provides an epoxy resin characterized in that it contains a group or groups represented by the following formula (1) and has a number average molecular weight of 400 to 10,000, an epoxy equivalent of 100 to 5,000 and an average number of glycidyl ether groups per molecule of 2 to 50:

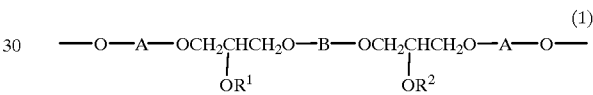

wherein,

A is a group represented by the formula (2)

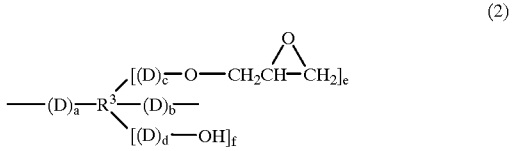

wherein $R^3$ represents a straight-chain or branched-chain saturated aliphatic polyhydric alcohol residue having 2 to 30 carbon atoms which may have cyclohexylene group(s), D represents an oxyalkylene group having 2 or 3 carbon atoms, a, b, c and d each represents an integer of 0 to 25, e and f each represents an integer of 0 to 4, e+f is equal to an integer of 0 to 4 and a+b+c×e+d×f is equal to an integer of 0 to 50, and B is a group represented by the formula (3)

(wherein $R^4$ is a group

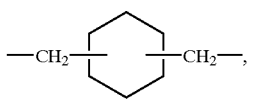

a group

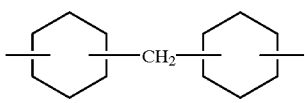

or a group

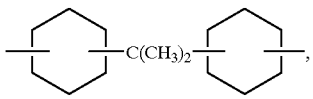

D has the same meaning as in the formula (2), and g and h each reppresents an integer of 0 to 18), and
$R^1$ and $R^2$ are the same or different and each represents a hydrogen atom, a glycidyl group or a group represented by the following formula (pp)

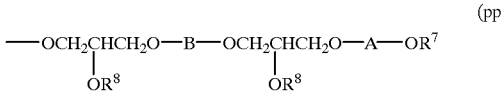
(pp)

wherein A and B each has the same meaning as defined above and $R^7$, $R^8$ and $R^9$ represent a hydrogen atom or glycidyl group.

The present invention also provides a process for preparing an epoxy resin comprising the steps of:
(a) subjecting
(i) a polyol represented by the formula (4)

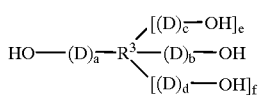
(4)

wherein $R^3$, D, a, b, c, d, e and f, e+f, a+b+cxe+dxf have the same meanings as in the formula (2),
(ii) an epihalohydrin, and
(iii) a diglycidyl ether represented by the formula (5)

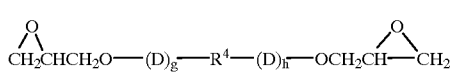
(5)

wherein $R^4$, D, g and h have the same meanings as in the formula (3) to addition reaction in the presence of a Lewis acid to give an addition reaction product, and
(b) subjecting the obtained addition reaction product to ring-closing reaction in the presence of a basic compound.

The present invention also provides a photo-curable epoxy resin composition comprising:
(i) at least one of said epoxy resins of the present invention which has an epoxy equivalent of 130 to 5,000, and
(ii) at least one cationic photoinitiator.

Further, the present invention provides a resin composition for powder coatings, the composition comprising:
(i) at least one of the foregoing epoxy resins of the invention which has a number average molecular weight of 500 to 10,000 and an epoxy equivalent of 200 to 5,000, and (ii) at least one compound capable of reacting with epoxy groups to form crosslinked product(s).

The inventors of the present invention conducted extensive research to provide an epoxy resin which can overcome the foregoing conventional problems, and found the following. The present invention has been accomplished based on these novel findings.

(i) An epoxy resin having a group or groups represented by the above formula (1) can be produced in a commercially advantageous manner by subjecting the specific polyol of the formula (4), the epihalohydrin and the diglycidyl ether compound of the formula (5) having a specific alicyclic skeleton ($R^4$) to addition reaction, followed by ring-closing reaction in the presence of a basic compound.

(ii) The number average molecular weight of the epoxy resin can be adjusted to a desired range by selecting the feed ratio of the diglycidyl ether compound (5) relative to the polyol (4).

(iii) The average number of functional groups (average number of glycidyl ether groups) per molecule can be adjusted to a desired range by selecting the feed ratio of the epihalohydrin relative to the polyol (4).

(iv) The epoxy resin prepared by the foregoing process is not disclosed in literature.

(v) The epoxy resin is a useful material for coating compositions such as cationic electrophoretic coating compositions, powder coatings, solvent-based coating compositions, etc., molding materials, encapsulants, cationic polymerizable resins, cationic polymeriable UV-curable resin compositions, stabilizers for polyvinylchloride resins, etc. When used for such applications, the epoxy resins can exhibit a high efficiency in operations, a high curability and give cured products which is excellent in weatherability and resistance to hydrolysis.

In the formula (1) and the related formulas, the saturated aliphatic polyhydric alcohol residue represented by $R^3$ is a group formed by removing all the hydroxyl groups, and all of the oxyalkylene group(s) if there is(are) such oxyalkylene group(s), from the polyol of the formula (4).

Preferred examples of "straight-chain or branched-chain saturated aliphatic polyhydric alcohol residue having 2 to 30 carbon atoms which may contain at least one cyclohexylene group" represented by $R^3$ are straight-chain or branched-chain saturated aliphatic polyhydric alcohol residues having 6 to 30 carbon atoms, preferably 8 to 15 carbon atoms, which has one or more, preferably 1 to 2, cyclohexylene groups.

Among these saturated aliphatic polyhydric alcohol residues, more preferred are those represented by the following formulas:

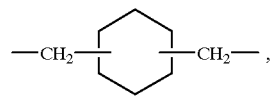
(2-1)

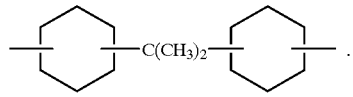
(2-2)

Among them, the group of the formula (2—2) is particularly preferred.

Of the epoxy resin according to the present invention, preferred are epoxy resins which contains a group or groups represented by the following formula (1a) and which has a number average molecular weight of 400 to 10,000, an epoxy equivalent of 100 to 5,000 and an average number of glycidyl ether groups per molecule of 2 to 50:

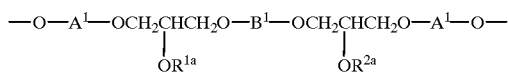

wherein $A^1$ and $B^1$ are the same or different and each represents

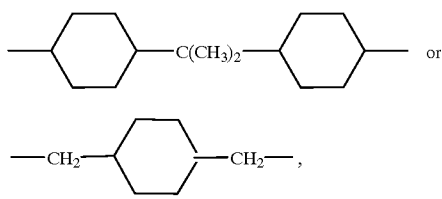

or $R^{1a}$ and $R^{2a}$ are the same or different and each represents a hydrogen atom, glycidyl group or a group represented by the formula (p)

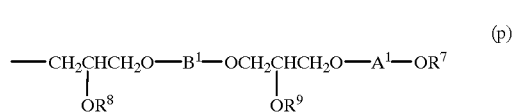

(wherein $A^1$ and $B^1$ have the same meanings as above and $R^7$, $R^8$ and $R^9$ are the same or different and represent a hydrogen atom or glycidyl group).

Particularly preferred is an epoxy resin which contains a group or groups represented by the foregoing formula (1a) wherein $A^1$ and $B^1$ are identical and each represents a group

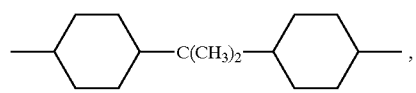

$R^{1a}$ and $R^{2a}$ each represents a hydrogen atom, glycidyl group or a group represented by the following formula (p-1) and which has a number average molecular weight of 400 to 10,000, an epoxy equivalent of 100 to 5,000 and an average number of glycidyl ether groups per molecule of 2 to 50:

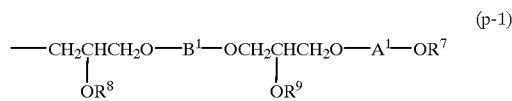

wherein $A^1$ and $B^1$ are identical and each represents a group

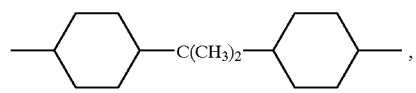

and $R^7$, $R^8$ and $R^9$ are the same or different and represent a hydrogen atom or glycidyl group.

As to the oxyalkylene groups having 2 to 3 carbon atoms which are represented by D, the moieties $-(D)_a-$, $-(D)_b-$, etc. indicate a polyoxyalkylene group, especially a group derived from ethylene oxide (EO) or propylene oxide (PO) adducts (the number of moles thereof added corresponds to the integer represented by a, b, etc.). The polyoxyalkylene group includes those derived from the co-adducts of EO and PO.

Among the epoxy resins of the present invention, those having an epoxy equivalent of 130 to 5,000 are suitably employed in combination with a cationic photoinitiator for use as a photo-curable resin composition.

Among the epoxy resins of the present invention, those having a number average molecular weight of 500 to 10,000 and an epoxy equivalent of 200 to 5,000 are suitably employed in combination with at least one compound capable of reacting with epoxy group(s) to form crosslinked product(s), for use as a resin composition for powder coatings.

In the description and claims, "number average molecular weight" is determined by the analysis of the results of gel permeation chromatography, followed by calculation using the calibration curve of polystyrene.

Preparation of the Epoxy Resin of the Invention

The epoxy resin of the invention can be prepared by various processes, preferably by a process comprising the steps of:

(a) subjecting
(i) a polyol represented by the formula (4)

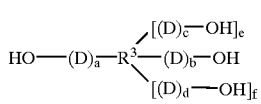

wherein $R^3$, D, a, b, c, d, e and f, e+f, and a+b+c× e+d×f are as defined in the formula (2),
(ii) an epihalohydrin, and
(iii) a diglycidyl ether represented by the formula (5)

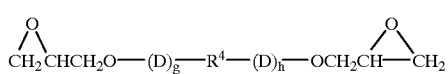

wherein $R^4$, D, g and h are as defined in the formula (3) to addition reaction in the presence of a Lewis acid to give an addition reaction product, and (b) subjecting the obtained addition reaction product to ring-closing reaction in the presence of a basic compound.

(i) Polyols Represented by the Formula (4)

Examples of the polyol represented by the formula (4) are straight-chain or branched-chain saturated aliphatic polyhydric alcohols, particularly dihydric through hexahydric alcohols, having 2 to 30 carbon atoms which may have one or more cyclohexylene groups. Examples thereof are 1,4-cyclohexanedimethanol, 1,3-cyclohexanedimethanol, 1,2-cyclohexanedimethanol, adducts thereof with 1–50 moles of alkylene oxide, hydrogenated bisphenol A, hydrogenated bisphenol F and adducts of these with 1–50 moles of alkylene oxide and other diols having an alicyclic skeleton, nuclear-hydrogenated phenol novolak or cresol novolak resin having up to 30 carbon atoms, ethylene glycol, diethylene glycol, polyethylene glycol, propylene glycol, dipropylene glycol, polypropylene glycol, neopentyl glycol, 2-n- butyl-2-ethylpropanediol, 1,3-butanediol, 1,4-butanediol, 3-methyl-1,5-pentanediol, 2,2-diethyl-1,3-propanediol, 2-methyl-2,4-pentanediol, 2-ethyl-1,3-hexanediol, 1,6-hexanediol, 2,2,4-trimethyl-1,3-pentanediol and other aliphatic diols, trimethylolpropane, trimethylolethane, glycerol, pentaerythritol, dipentaerythritol, sorbitol, xylitol and like tri(or more)-functional aliphatic polyols and adducts of these aliphatic polyols with an alkylene oxide (the number of moles thereof added : 1–50 moles), etc. These polyols can be used singly or at least two of them are usable in mixture.

In the description and the appended claims, the term "alkylene oxide" refers to an alkylene oxide having 2 or 3 carbon atoms, especially ethylene oxide (EO) or propylene oxide (PO), and the term "adducts with an alkylene oxide" includes adducts of one kind of these and co-adducts of two kinds of these alkylene oxides.

The use of a diol having an alicyclic skeleton or a mixture of a diol having an alicyclic skeleton and a tri(or more)-functional polyol, as the polyol component of the formula (4), is particularly recommendable, because the cured coating films of the resulting epoxy resin are provided with improved heat resistance and strength.

When the obtained epoxy resin is used for preparing a photo-curable resin composition, it is recommended to use hydrogenated bisphenol A, hydrogenated bisphenol F or cyclohexanedimethanol if the water resistance is important, and it is recommended to use said adducts with an alkylene oxide if the flexibility is important.

Further, when the obtained epoxy resin is used in preparing a resin composition for powder coatings, the polyol should preferably be one represented by the formula (4) wherein a, b, c and d are 0, namely one represented by the formula (4-c)

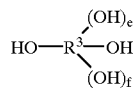

(4-c)

wherein $R^3$ is a straight-chain or branched-chain saturated aliphatic polyhydric alcohol residue having 6 to 30, preferably 8 to 15, carbon atoms which may have one or more, preferably 1 to 2, cyclohexylene groups, and e, f and e+f are as defined in the formula (2).

Examples of the polyol of the formula (4-c) are 1,4-cyclohexanedimethanol, 1,3-cyclohexanedimethanol, 1,2-cyclohexanedimethanol, hydrogenated bisphenol A, hydrogenated bisphenol F, 1,1'-dicyclohexanediol, nuclear-hydrogenated phenol novolak or cresol novolak resin having up to 30 carbon atoms, etc.

(ii) Epihalohydrin

Typical examples of useful epihalohydrins are epichlorohydrin, epibromohydrin, β-methylepichlorohydrin, β-methylepibromohydrin, etc. They can be used singly or at least two of them are usable in mixture.

(iii) Diglycidyl Ether Represented by the Formula (5)

Examples of the diglycidyl ether represented by the formula (5) are diglycidyl ethers of a diol which is typically hydrogenated bisphenol A, hydrogenated bisphenol F, 1,4-cyclohexanedimethanol, 1,3-cyclohexanedimethanol, 1,2-cyclohexanedimethanol and adducts of these with 1 to 36 moles of an alkylene oxide. These glycidyl ethers can be used singly or at least two of them are usable in mixture.

Diglycidyl ether of hydrogenated bisphenol A and 1,4-cyclohexanedimethanol diglycidyl ether are recommended when the water resistance is important, and the foregoing adducts thereof with alkylene oxide are recommended when the flexibility is important.

Further, when the obtained epoxy resin is used for preparing a resin composition for powder coatings, there is used a glycidyl ether of the formula (5) wherein g and h are each 0, namely a glycidyl ether of the formula (5-c)

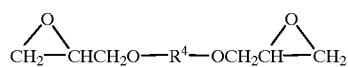

(5-c)

wherein $R^4$ has the same meaning as in the foregoing formula (5).

Examples of such diglycidyl ether of the formula (5-c) are diglycidyl ethers of a diol such as hydrogenated bisphenol A, hydrogenated bisphenol F, 1,1'-dicyclohexanediol, 1,4-cyclohexanedimethanol, 1,3-cyclohexanedimethanol, 1,2-cyclohexanedimethanol or the like. These can be used singly or at least two of them are usable in mixture. When improved water resistance and film strength are important, diglycidyl ether of hydrogenated bisphenol A is recommended.

(iv) Lewis Acid

In the present invention, examples of Lewis acids to be used as a catalyst for the addition reaction are butyltin trichloride, octyltin trichloride, stannic chloride and hydrates thereof, boron trifluoride, boron trichloride and complex compounds thereof, Friedel-Crafts catalysts, etc. These catalysts can be used singly or at least two of them are usable in mixture. Among them, stannic chloride and hydrate thereof are recommended.

(v) Basic Compound

Examples of the basic compound useful in the invention include hydroxides, carbonates, oxides, and alcolates of an alkali metal or alkaline earth metal such as sodium, potassium, magnesium, calcium or the like (e.g., alkoxides of alkali metals such as sodium, potassium, etc., particularly $C_1$–$C_2$ alkoxides), which are used in the form of a solid or a solution.

(vi) Process Steps

Specific processes for preparing the epoxy resins of the present invention are described below.

The process comprises an addition reaction step wherein a polyol of the formula (4), a glycidyl ether of the formula (5) and an epihalohydrin are reacted to give an addition reaction product (halohydrin ether) having a molecular weight in the specified range (hereinafter referred to as "addition step"), followed by a ring-closing reaction step wherein said addition reaction product (halohydrin ether) to dehydrohalogenation/ring-closing reaction in the presence of a basic compound to give the epoxy resin of the invention (hereinafter referred to as "ring-closing step").

Addition Step

The addition step can be advantageously carried out by one of the following two methods.

Method (A): A polyol of the formula (4) and a Lewis acid which is usually used in an amount of about 0.1 to about 1 mole % based on the hydroxyl groups of the polyol are fed, and a glycidyl ether of the formula (5) is added dropwise thereto at room temperature to 150° C. over a period of 0.5 to 2 hours for reaction, giving a polyether polyol, and then, an epihalohydrin is added dropwise thereto at room temperature to 150° C. over a period of 0.5 to 2 hours for reaction. This reaction is usually effected at atmospheric pressure and is completed in 0.5 to 6 hours, giving an addition reaction product (halohydrin ether).

Method (B): A polyol of the formula (4) and a Lewis acid which is usually used in an amount of about 0.1 to about 1 mole % based on the hydroxyl groups of the polyol are fed, and an epihalohydrin and a glycidyl ether of the formula (5) are added dropwise thereto at room temperature to 150° C., either alternately or simultaneously, over a period of 0.5 to 2 hours for reaction. The reaction is usually effected at atmospheric pressure and is completed in 0.5 to 6 hours, giving an addition reaction product (halohydrin ether). In Method (B), when the polyol of the formula (4) is not completely melted at the reaction temperature, the addition step can be carried out under the condition in which the polyol of the formula (4) has been partly or completely dissolved in the halohydrin ether. Thus Method (B) is effective in inhibiting side reactions such as the polymerization of the epoxy groups alone.

Said addition reaction product (halohydrin ether) contains a group or groups represented by the formula (he) and has a number average molecular weight of about 470 to 16,000 and a hydrolyzable halogen atom content of about 0.13 to 8.5 mmole/g:

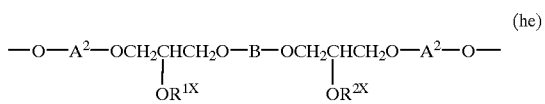

wherein $A^2$ is a group represented by the formula (he-2)

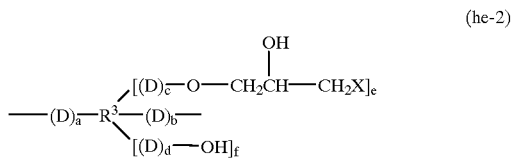

(wherein $R^3$ is a straight-chain or branched-chain saturated aliphatic polyhydric alcohol residue having 2 to 30 carbon atoms which may have one or more cyclohexylene groups, D represents an oxyalkylene group having 2 or 3 carbon atom, a, b, c and d each represents an integer of 0 to 25, e and f each represents an integer of 0 to 4, e+f is an integer of 0 to 4 and a+b+c×e+d×f is an integer of 0 to 50.), B has the same meaning as in the formula (1), $R^{1x}$ and $R^{2x}$ are the same or different and each represents a hydrogen atom, a group represented by the formula

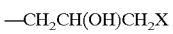

(wherein X is a halogen atom) or a group represented by the formula

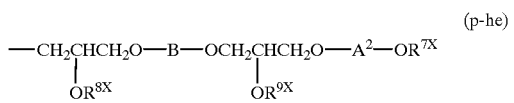

(wherein $A^2$ and B has the same meanings as defined above, and $R^{7X}$, $R^{8X}$ and $R^{9X}$ are the same or different and each represents a hydrogen atom or —CH$_2$CH(OH)CH$_2$X (wherein X represents a halogen atom)).

Ring-closing Step

In the ring-closing step, a basic compound is added usually in an amount of about 1.0 to about 2.0 equivalents based on the hydrolyzable halogen atom of this addition reaction product (halohydrin ether) to effect dehydrohalogenation at a pressure between reduced pressure (usually down to about 20 mmHg) and atmospheric pressure and at about 30 to about 100° C. for a period of 0.5 to 6 hours, thereby completing the ring-closing reaction. In this step, water may be distilled off to maintain the concentration of alkali at a high level.

A phase transfer catalyst may be added usually in an amount of about 0.05 to about 1.0% by weight based on the halohydrin ether for the purpose of promoting the dehydrohalogenation/ring-closing reaction.

Examples of such phase transfer catalysts are quaternary ammonium salts such as tetramethylammonium chloride, tetraethylammonium chloride, benzyltrimethyl-ammonium chloride and the corresponding bromides thereof, crown ethers such as 12-crown-4-ether, 15-crown-5-ether, etc.

Subsequently, salts produced as a by-product and unreacted basic compound are removed by properly combining procedures such as filtration, washing with water, centrifugation, adsorption, dehydration, etc. (hereinafter referred to as "post-treatment step").

In the foregoing process steps, it is preferable to use, in the addition step and/or ring-closing step, a solvent which is free of active hydrogen such as a hydroxyl group, carboxylic acid group and/or amino group in an amount of about 5 to about 200% by weight based on the weight of the charge (i.e., the total weight of a polyol of the formula (4), a diglycidyl ether of the formula (5), an epihalohydrin and a Lewis acid), and by doing so, the viscosity of the system can be reduced and side reactions such as the polymerization of epoxy groups alone and the cleavage of the epoxy groups formed in the ring-closing reaction can be effectively inhibited.

When a solvent is used, the solvent may be removed, or alternatively, instead of removing the solvent, a final product may be provided in the form of a solution. It is possible to use different solvent in each of the addition step, ring-closing step and post-treatment step.

Examples of the solvent are hydrocarbons such as benzene, toluene, xylene, n-hexane, cyclohexane, etc., ethers such as diisopropyl ether, ethylene glycol dimethyl ether, diethylene glycol dimethyl ether, dioxane, anisole, etc., ketones such as methyl ethyl ketone, methyl isobutyl ketone, acetone, etc., esters such as ethyl acetate, butyl acetate, cellosolve acetate, dimethyl phthalate, etc. Among them, ethers and hydrocarbons are recommendable.

The epoxy resin of the invention is, as set forth hereinbefore, about 400 to about 10,000, preferably about 500 to about 5,000 in number average molecular weight. The epoxy resin having a number average molecular weight in this range can be prepared by properly selecting the proportions of the polyol of the formula (4) and the diglycidyl ether of the formula (5) to be fed in the addition step, and subjecting them to addition reaction.

Stated more specifically, in Method (A), the equivalent ratio of the epoxy group of the diglycidyl ether of the formula (5) to the hydroxyl group of the polyol of the formula (4) (hereinafter referred to as "epoxy/hydroxy equivalent ratio") is in the range of from about 0.01 to less than 1, particularly from about 0.1 to about 0.9. When the epoxy/hydroxyl equivalent ratio is 1 or more, a three-dimensional crosslinking occurs in the course of the reaction and causes gelation, making it difficult to effect the production, whereas when the epoxy/hydroxyl equivalent ratio is less than 0.01, it is not possible to obtain an epoxy resin having a molecular weight in the specified range.

In Method (B), the epoxy/hydroxyl equivalent ratio is adjusted to the range from about 0.01 to less than 1, particularly from about 0.1 to about 0.9, as in Method (A), and the timing of addition and/or the speed of dropwise addition of an epihalohydrin and a glycidyl ether of the formula (5) is adjusted in such a manner that the number of moles of the epoxy groups present in the reaction system will not exceed the number of moles of the hydroxyl groups to which an epihalohydrin has not been added. If the number of moles of the epoxy groups present in the reaction system exceeds the number of moles of the hydroxyl groups to which the epihalohydrin is not added, the excess epoxy groups cause a three-dimensional crosslinking in the course of the reaction and give rise to gelation, making it difficult to effect the production.

In both of Methods (A) and (B), it is preferred that at least 70%, preferably at least 90%, of the epoxy groups of said diglycidyl ether have been consumed in the addition reaction. If the conversion of the epoxy groups of the diglycidyl ether is less than 70%, it is often difficult to obtain an epoxy resin having a molecular weight in the desired range.

The epoxy equivalent of the epoxy resin according to the invention is, as stated above, about 100 to about 5,000, preferably about 200 to about 2,500 and the average number of epoxy groups per molecule, namely the average number of glycidyl ether groups per molecule is about 2 to about 50, preferably about 2 to about 25. These values can be controlled by properly selecting the proportions of the polyol of the formula (4) and the epihalohydrin to be used. Stated more specifically, the equivalent ratio of the epihalohydrin to the hydroxyl groups of the polyol of the formula (4) is about 0.1 to about 2, preferably about 0.1 to about 1.5.

The epoxy resin of the invention is described below with respect to the respective uses, i.e., (I) wherein it is cured with a usual curing agent, (II) wherein it is used in the form of a photo-curable resin composition and (III) wherein it is used in the form of powder coatings.

(I) Use with a Usual Curing Agent for Curing

When the epoxy resin according to the present invention, namely the epoxy resin having group(s) represented by the foregoing formula (1) or the epoxy resin prepared by the foregoing process, is used for curing with a curing agent such as an acid anhydride compound, hydroxyl group-containing compound, amine compound, phenol compound, isocyanate, etc., it is recommended that the epoxy resin according to the present invention have a number average molecular weight of about 400 to about 10,000, particularly about 500 to about 5,000. If an epoxy resin of less than 400 in number average molecular weight is used as a resin component, more specifically for cationic electrophoretic coating compositions, solvent-based coating compositions, epoxy resin compositions and the like, the resulting coating films or cured products are brittle. On the other hand, above 10,000 in number average molecular weight, the composition is highly viscous and less soluble in a solvent, thereby tending to reduce the efficiency in operations.

The epoxy resin of the invention has glycidyl ether groups and hydroxyl groups, and therefore can be cured by means of various kinds of curing agents such as acid anhydride compounds, hydroxyl group-containing compounds, amine compounds, phenol compounds, isocyanates, etc.

Such a curing agent is selected according to the intended use. For example, aliphatic polyamine curing agents are suitable for the curing of outdoor coating compositions, especially in the applications which require the ability of curing at ambient temperature. On the other hand, acid anhydride curing agents are used when curing by heating can be used and higher heat resistance and mechanical, electrical and optical properties are required, for example, in encapsulation of light-emitting diodes and the like.

Specific examples of the polyamine curing agents are ethylenediamine, tetramethylenediamine, hexamethylenediamine, diethylenetriamine, iminobispropylamine, bis(hexamethylene)triamine, triethylenetetramine, tetraethylenepentamine, pentaethylenehexamine, 1,3,6-trisaminomethylhexane, N-benzylethylenediamine, trimethylhexamethylenediamine, dimethylaminopropylamine, diethylaminopropylamine, aminoethylethanolamine, diethylene glycol.bispropylenediamine, menthenediamine, isophoronediamine, N-aminoethylpiperazine, diaminodicyclohexylmethane, bis(4-amino-3-methylcyclohexyl)methane, 1,3-bis(aminomethyl)cyclohexane, 3,9-bis(3-aminopropyl)-2,4,8,10-tetraoxaspiro[5,5]undecane, mixtures of these, products prepared by modifying these by means of carboxylic acids, epoxy compounds, methyl methacrylate, phenol-formaldehyde, acrylonitrile and the like.

The amount of the polyamine curing agent to be used is not specifically limited insofar as the intended effect can be achieved, but usually the equivalent ratio of active hydrogens in the curing agent to the epoxy groups is about 0.5 to about 1.2, preferably about 0.7 to about 1.0.

Examples of useful acid anhydride curing agents are hexahydrophthalic anhydride, tetrahydrophthalic anhydride, phthalic anhydride, 3-methylhexahydrophthalic anhydride, 4-methylhexahydrophthalic anhydride, 3-methyltetrahydrophthalic anhydride, 4-methyltetrahydrophthalic anhydride, methylnadic anhydride, dodecenylsuccinic anhydride, Diels-Alder reaction products of a decatriene such as α-terpinene or alloocimene with maleic anhydride, hydrides thereof, structural isomers thereof, geometrical isomers thereof, mixed isomers thereof, etc.

The amount of the acid anhydride curing agent to be used is not specifically limited insofar as the intended effect is achieved, but usually the equivalent ratio of the acid anhydride groups to the epoxy groups is about 0.7 to about 1.2, preferably about 0.8 to about 1.1.

The curing agent for use in the present invention can be used conjointly with an accelerator, when so required. Useful accelerators include, for example, conventional compounds, e.g. tertiary amines such as benzyldimethylamine, tris(dimethylaminomethyl)phenol, dimethylcyclohexylamine, etc.; imidazoles such as 2-ethyl-4-methylimidazole, 2-methylimidazole, 1-benzyl-2-methylimidazole, etc.; diazabicycloalkenes such as 1,8-diazabicyclo(5,4,0)undec-7-ene and the like and salts thereof, organometallic compounds such as zinc octanoate, stannous octanoate, aluminum acetylacetonate, etc.; quaternary ammonium compounds; organic phosphorus compounds such as triphenylphosphine, triphenylphosphite, etc.; boron compounds such as boron trifluoride, triphenyl borate, etc.; metal halides such as zinc chloride, stannic chloride, etc.

The amount of the accelerator to be used can be suitably selected according to the kind of the curing agent, and is usually about 0.01 to about 10 parts by weight, preferably about 0.05 to 5 parts by weight, per 100 parts by weight of the epoxy resin.

Said accelerator can be used as the component of a curing agent composition or can be incorporated, together with other additives, during the preparation of an epoxy resin composition.

Examples of such other additives are plasticizers, dyes, pigments (such as titanium oxide), mold release agents, antioxidants, ultraviolet absorbents, light stabilizers, flame retardants, fillers, leveling agents, anti-foaming agents, thixotropic agents, solvents, and like additives as well as extenders, etc. The amount of said other additives to be used in the invention is not specifically limited insofar as the intended effect is not adversely affected.

As the recommended curing conditions, there may be mentioned a condition of a temperature of 10 to 100° C. for 0.1 to 24 hours when the amine curing agent is used, and a condition of a temperature of 60 to 160° C. for 0.1 to 24 hours when the acid anhydride curing agent is used. Excessive heating is accompanied by heat deterioration of the cured products and causes coloring or reduction in the strength, and therefore the curing condition is suitably selected considering the balance with the desired physical properties.

The thus obtained epoxy resin compositions are useful for paints, molding materials, encapsulants, etc., particularly for cationic electrophoretic coating compositions, powder coatings, solvent based coating compositions, etc., and are also suitable as cationic polymerizable, heat-curable or UV-curable resins, stabilizers for polyvinylchrorride resins, etc. Furthermore, these epoxy resins are saturated compounds wherein the bonds of main chain are carbon-carbon bonds and ether linkages only, and thus have such a high weatherability and hydrolysis resistance that they are suitable for outdoor applications.

(II) Use in the Form of Photo-curable Resin Compositions

When the epoxy resin of the invention, namely the epoxy resin having a group or groups of the formula (1) or the epoxy resin prepared by the foregoing process, is used for preparing a photo-curable resin composition, it is recommendable that the epoxy resin have a number average molecular weight of about 400 to about 10,000, preferably about 400 to about 5,000. With an increase in the number average molecular weight, the photo-curing rate increases. However, if the number average molecular weight is less than 400, the photo-curing rate lowers and the cured coating film of the resulting composition is brittle. On the other hand, in excess of 10,000, the viscosity of the resulting composition is too high and the amenability of operation such as coating tends to decrease.

The more the average number of glycidyl ether groups in the epoxy resin of the present invention is, the better the photo-curing property is. However, the average number of glycidyl ether groups in the epoxy resin of the present invention is preferably 2 to 50, preferably 2 to 25. If the average number is less than 2, insufficient photo-curing property results, whereas above 50, the cured coating film or the cured product is likely to become brittle.

The epoxy equivalent of the epoxy resin of the present invention is in the range of about 130 to about 5,000, preferably about 200 to about 2,500. Below 130, the cured coating film and the cured product is brittle, whereas above 5,000, unsatisfactory photo-curing property results, and the cured product tends to have decreased water resistance since many hydroxyl groups remain.

When the epoxy resin of the present invention having a high number average molecular weight is used, preferably an epoxy compound represented by the formula (6) given below is used conjointly with the present epoxy resin to reduce the viscosity and to increase the efficiency in operations such as coating or casting.

The amount of the epoxy compound of the formula (6) can be selected from a wide range, but it may be an amount effective to adjust the mixture of the present epoxy resin and the epoxy compound of the formula (6) to a viscosity which facilitates photo-curing, particularly to a viscosity in the range of about 50 to about 50000 centipoises, preferably about 50 to about 30000 centipoises (as measured by a Brookfield type viscometer at 25° C.).

Generally, the epoxy compound of the formula (6) is used in an amount of up to about 1000 parts by weight, preferably 0 to about 500 parts by weight, per 100 parts by weight of the epoxy resin of the invention.

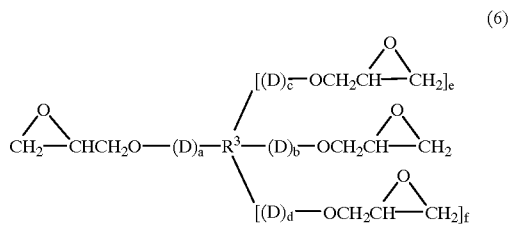

wherein $R^3$, D, a, b, c, d, e and f, e+f, a+b+c×e+d×f are as defined in the formula (2).

Preferred examples of the compound of the formula (6) are diglycidyl ether of hydrogenated bisphenol A, diglycidyl ether of cyclohexanedimethanol, tetraglycidyl ether of pentaerythritol, triglycidyl ether of trimethylolpropane, and the like.

The epoxy resin of the invention may be used alone, and may also be used in combination with other epoxy compounds than the epoxy compound of the formula (6). In this case, the epoxy resin of the invention is preferably used in an amount of 10% by weight or more, preferably 50% by weight or more, based on the total amount of the epoxy resin of the invention and said other epoxy compound.

Examples of said other epoxy compound are bisphenol based epoxy resins such as diglycidyl ether of bisphenol A, diglycidyl ether of bisphenol F, etc., alicyclic epoxy resins such as 3,4-epoxycyclohexylmethyl-3',4'-epoxycyclohexanecarboxylate, di(3,4-epoxycyclohexylmethyl)adipate, tetra(3,4-epoxycyclohexylmethyl)butanetetracarboxylate, butanetetracarboxylate, di(3,4-epoxycyclohexylmethyl)-4,5-epoxytetrahydrophthalate, etc., novolak based epoxy resins, cresol novolak based epoxy resins, glycidyl ester based epoxy resins such as glycidyl ester of neo-alkanoic acid, diglycidyl esters of hexahydrophthalic acid and of tetrahydrophthalic acid, etc., diglycidyl ethers of hydrogenated bisphenol A and of hydrogenated bisphenol F, diglycidyl ethers prepared from alcohols such as 1,4-cyclohexanedimethanol, alkylene oxide adducts of bisphenol A, polypropylene glycols, polyethylene glycols, 1,6-hexanediol, neopentyl glycol, etc.

The use of said alicyclic epoxy resin improves the photo-curing properties, allows further reduction in the viscosity and results in higher efficiencies in coating or other operations.

The amount of the alicyclic epoxy resin to be used is preferably 0 to 50% by weight. The amount of more than 50% by weight reduces the adhesion, flexibility and impact resistance and is hence undesirable.

The cationic photoinitiators to be used in the invention include compounds heretofore known, such as pyridinium salts, aromatic diazonium salts, aromatic iodonium salts, aromatic sulfonium salts, benzylsulfonium salts, cinnamyl sulfonium salts, aromatic selenium salts and organic metal compounds, etc. Used as the counter ion therefor are anions such as $SbF_6^-$, $PF_6^-$, $AsF_6^-$, $BF_4^-$, etc.

More specific examples are:
  pyridinium salts such as N-benzyl-4-benzoyl pyridinium hexafluoroantimonate, N-cinnamyl-2-cyanopyridinium hexafluoroantimonate, N-(3-methyl-2-butenyl)-2-cyanopyridinium hexafluorophosphate and the like which are disclosed in Japanese Unexamined Patent Publications Nos.327574/1992, 222112/1993 and 262813/1993, etc.;

aromatic diazonium salts such as p-chlorobenzenediazonium hexafluorophosphate, p-methoxybenezenediazonium hexafluorophosphate, 2,5-diethoxy-4-toluylthiobenzenediazonium hexafluorophosphate and the like;

aromatic iodonium salts such as diphenyliodonium hexafluorophosphate, 4,4-di-tert-butylphenyliodonium hexafluorophosphate and the like;

aromatic sulfonium salts such as triphenylsulfonium hexafluorophosphate, bis-[4-(diphenylsulfonio)phenyl]sulfide-bis-hexafluorophosphate and the like;

benzylsulfonium salts such as α-phenylbenzylmethylsulfonium hexahydrophosphate, α-naphthylmethyldimethylsulfonium hexafluoroantimonate, α-naphthylmethyltetramethylenesulfonium hexafluorophosphate and the like which are exemplified in Japanese Unexamined Patent Publications Nos. 308563/1992 and 140209/1993, etc.;

cinnamylsulfonium salts such as cinnamyldimethylsulfonium hexafluoroantimonate, cinnamyltetramethylene sulfonium hexafluoroantimonate and the like which are exemplified in Japanese Unexamined Patent Publication No. 140210/1993, etc.; and aromatic selenium salts such as triphenylselenium hexafluorophosphate and the like.

Useful organic metal compounds include, for example, metallocene compounds, silanol/aluminum complex composite initiators, etc. More specific examples of such compounds are ($\eta^6$-benzene)($\eta^5$-cyclopentadienyl)iron (II) hexafluorophosphate, ($\eta^6$-isopropylbenzene)($\eta^5$-cyclopentadienyl)iron (II) hexafluorophosphate, a combination of o-nitrobenzylsilyl ether or triphenylsilyl-tert-butyl peroxide and an aluminum complex, etc. Examples of such aluminum complex are tris(ethylacetoacetato)aluminum, tris(salicylaldehydato)aluminum, tris(acetylacetonato)aluminum, tris(2,6-dimethyl-3,5-heptanedionato)aluminum, etc.

Particularly recommended cationic photoinitiators include said pyridinium salts, benzylsulfonium salts and cinnamylsulfonium salts, which are excellent in compatibility with the epoxy resin of the present invention, and impart good thermal coloring resistance and high weatherability to the coatings formed by photocuring the resulting epoxy resin compositions of the invention. When said pyridinium salt initiator is used in combination with a compound capable of producing an active radical by light irradiation, the photo-curing property is increased, and dark reaction is allowed to proceed at room temperature or elevated temperature after light irradiation. Their combined use is recommended for uniformly curing a thick coating.

Examples of said compounds capable of producing an active radical by light irradiation are methyl ethyl ketone peroxide, cyclohexanone peroxide, cumene hydroperoxide, isobutyl peroxide, benzoyl peroxide, tert-butyl peroxyacetate and like peroxide compounds azoisobutyronitrile and like azo compounds, azide compounds, disulfide compounds, etc.

The cationic photoinitiator is usually used in an amount of about 0.01 to about 10 parts by weight, preferably about 0.1 to about 6 parts by weight, per 100 parts by weight of the epoxy resin of the present invention (or per 100 parts by weight of the total amount of the epoxy resin of the present invention, said compound of the formula (6) and/or said other epoxy resin and/or a cationic polymerizable monomer to be described below, when the epoxy resin of the invention is used in combination with one or more of these polymerizable components). If it is used in an amount of less than 0.01 part by weight, reduced photo-curing property results, whereas if it is used in an amount of more than 10 parts by weight, the water resistance of the resulting cured product decreases. Hence the amount outside said range is undesirable.

The photo-curable epoxy resin composition of the present invention may contain vinyl ethers, cyclic ethers, cyclic esters, bicyclo-orthoesters or spiro-orthocarbonates as cationic polymerizable monomers, and polyols compolymerizable with the present epoxy resin.

Examples of the vinyl ethers are triethylene glycol divinyl ether, cyclohexanedimethanol divinyl ether, hydroxybutyl vinyl ether, dodecyl vinyl ether, etc. The incorporation of these vinyl ethers increases the photo-curing property and decreases the viscosity, thereby improving the operational efficiency.

The amount of the vinyl ether to be used is preferably 0 to 40 parts by weight per 100 parts by weight of the epoxy resin of the present invention. The amount exceeding 40 parts by weight impairs the thermal coloring resistance and the like and is thus undesirable.

Examples of said cyclic ethers include 3,3-bischloromethyloxetane, alkoxyoxetane, tetrahydrofuran, dioxolan, trioxane, etc.

Examples of said cyclic esters include propiolactone, caprolactone, etc.

Examples of said bicyclo-orthoesters include 1-phenyl-4-ethyl-2,6,7-trioxabicyclo[2,2,2]octane.

Examples of said spiro-orthocarbonates include 1,5,7,11-tetraoxaspiro[5,5]undecane.

Examples of said polyols include diols having alicyclic skeleton such as 1,4-cyclohexanedimethanol, 1,3-cyclohexanedimethanol, 1,2-cyclohexanedimethanol and adducts of these with 1–50 moles of an alkylene oxide, hydrogenated bisphenol A, hydrogenated bisphenol F, adducts of these with 1–50 moles of an alkylene oxide, and the like, aliphatic diols such as ethylene glycol, diethylene glycol, polyethylene glycol, propylene glycol, dipropylene glycol, polypropylene glycol, neopentyl glycol, 2-n-butyl-2-ethylpropanediol, 1,3-butanediol, 1,4-butanediol, 3-methyl-1,5-pentanediol, 2,2-diethyl-1,3-propanediol, 2-methyl-2,4-pentanediol, 2-ethyl-1,3-hexanediol, 1,6-hexanediol, 2,2,4-trimethyl-1,3-pentanediol and the like, tri(or more)-functional aliphatic polyols such as trimethylolpropane, trimethylolethane, glycerol, pentaerythritol, dipentaerythritol, sorbitol, xylitol and the like and adducts of such aliphatic polyols with 1–50 moles of an alkylene oxide or caprolactone, etc. These polyols can be used singly or at least two of them are usable in mixture.

Herein the alkylene oxide is used to collectively refer to ethylene oxide (EO), propylene oxide (PO) and a co-adduct thereof.

The photo-curable epoxy resin composition of the present invention may further contain a photosensitizer such as thioxanthone, 2-chlorothioxanthone, 2,4-diisopropylthioxanthone, 2,4-diethylthioxanthone, anthracene, benzophenone, acetophenone, perinone-perylenes, Acridine Orange R, benzoflavine, etc., photosensitizing accelerators such as triethylamine, triethanolamine, 2-dimethylaminoethanol, triphenylphosphine, β-thiodiglycol, etc., cationic polymerizable heat polymerization initiators, fillers, thickeners, plasticizers, ultraviolet absorbing agent, antioxidants, flame retardants; light stabilizers, tackifiers, solvents, extender pigments (silica, talc, barium sulfate, etc.), coloring agents, thixotropic agents, leveling agents, solvents, anti-foaming agents, etc. The amount of these additives to be used is not specifically limited insofar as they do not adversely affect the contemplated effect.

The photo-curable epoxy resin composition of the invention is prepared by stirring and mixing the components using a conventional apparatus and is stored in a dark place.

In curing the photo-curable epoxy resin composition of the invention, a mercury lamp, xenon lamp, carbon arc, metal halide lamp, sunlight, electron beam, laser beam and the like can be used as radiation sources.

The epoxy resin composition, after being photo-cured, can be further thermally post cured at a temperature of 50 to 200° C. The post cure is effective in curing a thick coating, a non-irradiated coating portion or a resin composition containing a filler or the like.

The photo-curable epoxy resin composition of the present invention is useful as a coating material such as gloss varnish for plastics, metals and the like or as a photo-curable resin for paints, adhesives, printing inks, photo-resists, encapsulants, plate materials for printing, etc.

(III) Use of the Present Epoxy Resin for Powder Coatings

When the epoxy resin of the present invention, namely the epoxy resin having group(s) of the formula (1) or the epoxy resin prepared by the foregoing process, is used in preparing a resin composition for powder coatings, one represented by the formula (1c) is used:

$$—O—A^3—OCH_2CHCH_2O—B^3—OCH_2CHCH_2O—A^3—O— \atop \phantom{—O—A^3—OCH_2}OR^1 \phantom{CH_2O—B^3—OCH_2}OR^2 \tag{1c}$$

wherein $A^3$ represents a group of the formula (2c)

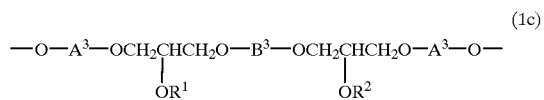

(2c)

wherein $R^3$ is a straight-chain or branched-chain saturated aliphatic polyhydric alcohol residue of 2 to 30 carbon atoms which may have cyclohexylene group(s), and e and f each represents an integer of 0 to 4, and e+f is an integer of 0 to 4, $B^3$ is a group of the formula (3) wherein g and h are 0, namely a group

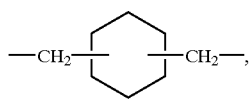

a group

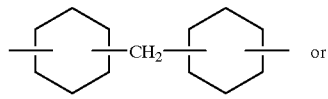 or a group

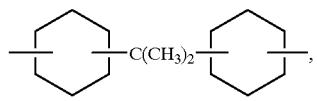, $R^1$ and $R^2$ are the same or different and each represents a hydrogen atom, a glycidyl group or a group of the formula (p-c)

$$—CH_2CHCH_2O—B^3—OCH_2CHCH_2O—A^3—OR^7 \atop \phantom{—CH_2}OR^8 \phantom{CH_2O—B^3—OCH_2}OR^9 \tag{p-c}$$

wherein $A^3$ and $B^3$ have the same meanings as in the formula (1c), and $R^7$, $R^8$ and $R^9$ are the same or different and each represents a hydrogen atom or a glycidyl group.

It is recommended that the above epoxy resin has a number average molecular weight of about 500 to about 10,000, particularly about 1,000 to about 5,000. If the number average molecular weight is less than 500, the resulting powder coating formulated tends to cause blocking since the particles of the powder coating adheres to each other by fusion at ambient temperature and pressure, e.g. during storage. If the number average molecular weight exceeds 10,000, the compatibility with other components of the composition is reduced, or the cured coating film is likely to have surface smoothness degraded due to an increased melt temperature.

The average number of glycidyl ether groups per molecule is preferably about 2 to about 50. The epoxy equivalent of the epoxy resin of the present invention (g/one equivalent of epoxy group) is preferably in the range of about 200 to about 5,000, particularly about 300 to about 2,500.

When the epoxy resin of the present invention is used as the component of a resin composition for powder coatings, if the epoxy equivalent is less than 200 and the average number of glycidyl ether groups per molecule is more than 50, the resulting powder coating tends to have inferior storage stability and to give a brittle cured coating film. If the epoxy equivalent exceeds 5,000 and the average number of glycidyl ether groups per molecule is less than 2, insufficient curability results and the cured product tends to have decreased water resistance since many hydroxyl groups remain.

Particularly, when the epoxy resin is used as a substitute for TGIC in resin compositions for polyester/TGIC based powder coatings, it is preferable to adjust the average number of glycidyl ether groups per molecule to about 2.5 to about 50, and the epoxy equivalent to about 200 to about 1,000. If the epoxy equivalent exceeds 1,000 and the average number of glycidyl ether groups is less than 2.5, it is likely that the cured coating film is insufficient in strength.

The epoxy resin of the invention can be used conjointly with other epoxy compounds insofar as the combined use does not adversely affect the intended effect. In this case, the proportion of the epoxy resin of the invention to be blended is preferably at least 50% by weight.

Examples of said other epoxy compounds are glycidyl compounds such as diglycidyl ether of bisphenol A, diglycidyl ether of hydrogenated bisphenol A, hexahydrophthalic acid diglycidyl ester, terephthalic acid diglycidyl ester and the like; alicyclic epoxy resins such as 3,4-epoxycyclohexylmethyl-3',4'-epoxycyclohexane carboxylate, di(3,4-epoxycyclohexylmethyl)-4,5-epoxytetrahydrophthalate and the like; high molecular weight epoxy compounds prepared from these glycidyl compounds or alicyclic epoxy resins and polyhydric phenols such as bisphenol A, dihydroxybenzene or the like and/or polybasic acids or acid anhydrides such as terephthalic acid, 1,2,3,4-butanetetracarboxylic acid, isocyanuric acid, hexahydrophthalic anhydride or the like; polymers of glycidyl acrylate, glycidyl methacrylate, allyl glycidyl ether or like glycidyl group-containing vinyl monomers as well as copolymers thereof with other vinyl compounds; etc.

The resin compositions for powder coatings according to the invention contains, as the essential component, a compound (B) which is capable of reacting with the epoxy groups of the epoxy resin of the invention to form crosslinked product(s), so as to provide a cured coating film.

Examples of said compound (B) include, for example, compounds having functional groups reactive with epoxy groups, such as acid anhydride groups, amino group, phenolic hydroxyl group, free carboxyl group, etc. More specific examples of compound (B) include, for example, compounds conventionally known as curing agents for epoxy resins (e.g. "SHIN EPOXY JUSHI (NEW EPOXY RESINS)" authored and edited by Hiroshi KAKIUCHI, page 164 and page 576, published by Kabushiki Kaisha Shokodo, 1985), carboxyl group-containing polyester resins, carboxyl group-containing acrylic resins, etc. which can constitute a resin composition for powder coatings which is solid at ambient temperature.

Among them, recommended are carboxyl group-containing polyester resins (hereinafter referred to as "said polyester resin").

Said polyester resin is constituted by a polyhydric alcohol component and a polycarboxylic acid component, and can be prepared by known processes as by subjecting to dehydration condensation a polyhydric alcohol and a polycarboxylic acid which is used in an excess amount relative to the polyhydric alcohol, or by subjecting to dehydration condensation a polycarboxylic acid and a polyhydric alcohol which is used in an excess amount relative to the polycarboxylic acid to give a hydroxyl-containing polyester resin, followed by addition reaction of the hydroxyl-containing polyester resin with an acid anhydride group-containing compound, or by using a methyl ester of the polycarboxylic acid in place of the polycarboxylic acid and carrying out condensation reaction with removal of methanol. There is no limitation on the preparation process.

Examples of such polyhydric alcohol component include, for example, ethylene glycol, propylene glycol, trimethylene glycol, 1,3-butanediol, 1,4-butanediol, neopentyl glycol, 1,6-hexanediol, 2-n-butyl-2-ethyl-1,3-propanediol, 3-methyl-1,5-pentanediol, 1,4-cyclohexanedimethanol, hydrogenated bisphenol A, trimethylolethane, trimethylolpropane, pentaerythritol, dipentaerythritol, glycerin, sorbitol, etc. These can be used singly or at least two of them are usable in admixture. Among them, neopentyl glycol is recommended.

Examples of the polycarboxylic acid component include, for example, succinic acid, 1,3-cyclohexanedicarboxylic acid, 1,4-cyclohexanedicarboxylic acid, hexahydrophthalic acid, tetrahydrophthalic acid, phthalic acid, isophthalic acid, terephthalic acid, adipic acid, azelaic acid, sebacic acid, trimellitic acid, and anhydrides and/or methyl esters of these. These can be used singly or at least two of them are usable in admixture. Among them, terephthalic acid is recommended.

It is recommended that the acid value (mg-KOH/g) of said polyester resin is about 10 to about 150, particularly about 30 to about 100. The acid value of less than 10 markedly reduces the strength and water resistance of the cured coating film, whereas the acid value of over 150 tends to impair the storage stability of the powder coatings and the surface smoothness of the cured coating film.

Recommendably, the melt temperature of said polyester resin is 40 to 150° C., particularly 60 to 130° C. The melt temperature of lower than 40° C. induces blocking of a powder coating, whereas the melt temperature of higher than 150° C. increases the melt viscosity, thereby tending to degrade the surface smoothness of the cured coating film.

Recommended proportions of the epoxy resin of the present invention and compound (B) are such that the equivalent ratio of the functional groups present in compound (B) that may react with epoxy groups/epoxy groups is preferably between about 0.5 and about 2.0, more preferably about 0.7 and about 1.5. The use of these components outside said range is likely to cause insufficient curing and to make it difficult to obtain the desired film properties.

The resin composition for powder coatings according to the present invention may further contain a curing promotor. As such curing promotors, there may be mentioned known compounds, such as imidazoles such as 2-undecylimidazole, 2-heptadecylimidazole, 1-cyanoethyl-2-undecylimidazole, etc.; quaternary ammonium salts such as tetraethylammonium bromide, tetrabutylammonium bromide, etc.; tertiary amines such as tris(dimethylaminomethyl)phenol, etc.; organometallic compounds such as zinc octanoate, stannous octanoate, aluminum acetylacetonate, etc.; organic phosphorus compounds such as triphenylphosphine, triphenylphosphite, etc.

The amount of the curing promotor to be used can be suitably selected according to the kind of the epoxy resin of the present invention, said polyester resin or curing agent, and is usually about 0.01 to about 10% by weight based on the epoxy resin of the invention.

The resin composition for powder coatings according to the present invention may also contain, when required, ultraviolet absorbents, antioxidants, light stabilizers, pigments, dyes, fillers, flame retardants, flowability adjusting agents, leveling agents, surface-tension adjusting agents, tackifiers, coupling agents, anti-foaming agents, etc. so far as they do not adversely affect the intended effect of the invention.

The resin composition for powder coatings according to the invention can be prepared using a known apparatus by mixing and melting the components, kneading the melt, followed by pulverization. The melt is kneaded usually at a temperature of about 70 to about 150° C. The epoxy resin of the present invention, said polyester resin and the curing agent, etc. may be present as simply mixed or may be partly reacted, insofar as the intended effect of the invention is not adversely affected.

The resin composition for powder coatings according to the invention is applied by electrostatic spraying, fluidization dip coating, etc. and is cured by baking at a temperature of at least 100° C., preferably at 120 to 250° C. The baking time usually ranges from 1 minute to 2 hours, and if desired, postcuring may further be carried out. The resin composition for powder coatings that has not been applied may be recovered for reuse.

The thus obtained resin composition for powder coatings according to the invention is used for applications in which the coating is exposed to outdoor light rays and like ultraviolet rays, and is especially useful as coating compositions for construction materials such as sashes, gate doors, fences, garages, etc. traffic-related articles such as guardrails, guardpipes, traffic-control sign boards, etc., vehicle-related articles such as automobiles, bicycles, motorbikes, etc., steel furniture, and light electrical appliances such as refrigerators, air conditioners, washing machines, lighting apparatus, etc.

EXAMPLES

The present invention will be described below in more detail with reference to Examples.

The following items are intended to mean the following:
1) Number average molecular weight (Mn): this is obtained by the analysis of the results of the gel permeation chromatography, followed by calculation using the calibration curve of polystyrene.
2) Average number of functional groups per molecule: this represents the average number of epoxy groups per molecule of the epoxy resin, which is calculated by (Mn/epoxy equivalent).
(3) Equivalent ratio of epoxy group/hydroxyl group: this represents the equivalent ratio of the epoxy groups of the diglycidyl ether of the formula (5) to the hydroxyl groups of the polyol of the formula (4).
(4) Equivalent ratio of epichlorohydrin/hydroxyl group: this represents the equivalent ratio of the epichlrohydrin to the hydroxyl groups in the polyol of the formula (4).

Example I-1

A reactor equipped with a mechanical stirrer, a decanter and a thermometer was charged with 72 g of 1,4-cyclohexanedimethanol (trade name "Rikabinol DM", product of New Japan Chemical Co., Ltd.), 400 g of xylene and 1.7 g of stannic chloride pentahydrate, followed by dissolution at 80° C. for 0.5 hour. The solution was cooled to 30° C. A 160 g quantity of diglycidyl ether of hydrogenated bisphenol A (trade name "Rikaresin HBE-100", product of new Japan Chemical Co., Ltd.) was fed to the reactor and the mixture was heated with stirring. The mixture was reacted at 100° C. for 2 hours, and then 55 g of epichlorohydrin was added dropwise at 100° C. over 0.5 hour. The mixture was aged at 100° C. for 1 hour to complete the addition reaction.

The mixture was cooled to 80° C. and 0.9 g of benzyltrimethylammonium chloride was added thereto. After addition of 24 g of solid sodium hydroxide at 80° C. over 0.5 hour, the resulting mixture was aged at 80° C. for 2 hours to complete the ring-closing reaction.

Then, sodium chloride produced as a by-product and the unreacted sodium hydroxide were removed by filtration and washing with water, and the water and xylene were evaporated off.

Consequently, an epoxy resin (epoxy resin A) was obtained which had an Mn of 1910, an epoxy equivalent of 476 and an average number of functional groups per molecule of 4.0. The equivalent ratio of epoxy group/hydroxyl group was 0.75 and the equivalent ratio of epichlorohydrin/hydroxyl group was 0.60. The weatherability and water resistance of the cured product prepared from this epoxy resin were evaluated and shown in Table 1 below.

The epoxy resin obtained above contains a group or groups represented by the following formula (i), and has a hydroxyl group or a glycidyl group at each terminal.

In the formula (i), $R^a$ and $R^b$ are the same or different and each represents a hydrogen atom, a glycidyl group or a group represented by the formula (i-2) wherein $R^c$, $R^d$ and $R^e$ are the same or different and each represents a hydrogen atom or a glycidyl group.

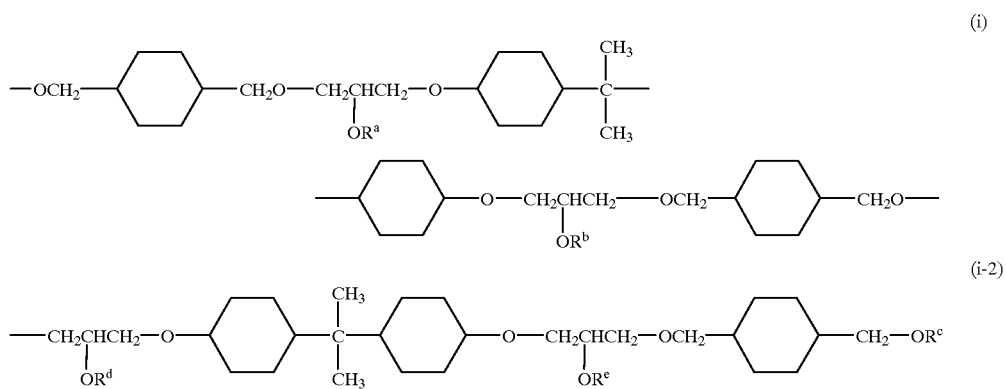

Example I-2

Into a reactor of the same type as used in Example I-1 were placed 123 g of hydrogenated bisphenol A (trade name "Rikabinol HB", product of New Japan Chemical Co., Ltd.) and 300 g of xylene, followed by dissolution at 130° C. for 0.5 hour. The solution was cooled to 100° C. and 1.9 g of stannic chloride pentahydrate was added. A 55 g quantity of epichlorohydrin was added dropwise at 100° C. over 0.5 hour, and the resulting mixture was aged at 100° C. for 1 hour. Then, 85 g of "Rikaresin HBE-100" was added at 100° C. over 0.5 hour to effect a reaction at 100° C. for 1.5 hours. A 55 g quantity of epichlorohydrin was added dropwise at 100° C. over 0.5 hour, followed by aging at 100° C. for 1 hour to complete the addition reaction.

Subsequently, 1.9 g of benzyltrimethylammonium chloride was added, and 142 g of a 50% aqueous solution of sodium hydroxide was added at 80° C. over 0.5 hour, followed by aging at 80° C. for 5 hours to complete the ring-closing reaction.

Then, sodium chloride produced as a by-product and the unreacted sodium hydroxide were removed by washing with water, and the water and xylene were evaporated off.

Consequently, an epoxy resin (epoxy resin B) was obtained which had an Mn of 1010, an epoxy equivalent of 302, and an average number of functional groups per molecule of 3.3. The equivalent ratio of epoxy group/hydroxyl group was 0.40 and the equivalent ratio of epichlorohydrin/hydroxyl group was 1.2. The weatherability and water resistance of the cured product prepared from this epoxy resin were evaluated and shown in Table 1 below.

The epoxy resin obtained above contains a group or groups represented by the following formula (ii), and has a hydroxyl group or a glycidyl group at each terminal.

In the formula (ii), $R^f$ and $R^g$ are the same or different and each represents a hydrogen atom, a glycidyl group or a group represented by the formula (ii-2) wherein $R^h$, $R^i$ and $R^j$ are the same or different and each represents a hydrogen atom or a glycidyl group.

The epoxy resin obtained above contains a group or groups represented by the foregoing formula (ii), and has a hydroxyl group or a glycidyl group at each terminal.

Comparative Example I-1

Into a reactor of the same type as used in Example I-1 were placed 72 g of "Rikabinol DM", 400 g of xylene and 1.7 g of stannic chloride pentahydrate, followed by dissolution at 80° C. for 0.5 hour. After cooling to 30° C., 234 g of "Rikaresin HBE-100" was added and the resulting mixture was heated with stirring. On reaching 90° C., the mixture gelled. At this stage, the equivalent ratio of epoxy group/hydroxyl group was 1.1.

Comparative Example I-2

Into a reactor of the same type as used in Example I-1 were placed 123 g of "Rikabinol HB", 160 g of diethylene glycol dimethyl ether and 2.2 g of stannic chloride pentahydrate, followed by dissolution at 100° C. for 0.5 hour.

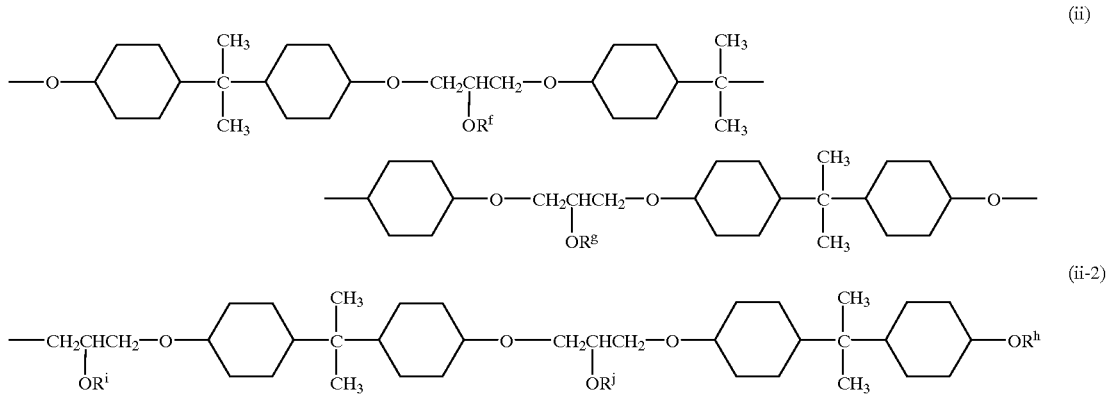

Example I-3

Into a reactor of the same type as used in Example I-1 were placed 123 g of "Rikabinol HB", 160 g of diethylene glycol dimethyl ether and 2.2 g of stannic chloride pentahydrate, followed by dissolution at 100° C. for 0.5 hour. A 149 g quantity of "Rikaresin HBE-100" was added at 100° C. over 1 hour and the mixture was reacted at 100° C. for 1 hour. Then, 110 g of epichlorohydrin was added dropwise at 100° C. over 0.5 hour, followed by aging at 100° C. for 1 hour to complete the addition reaction.

Then, the diethylene glycol dimethyl ether was evaporated off under reduced pressure, and then 400 g of xylene was added for dissolution. Subsequently 1.8 g of benzyltrimethylammonium chloride was added and 48 g of solid sodium hydroxide was added at 80° C. over 0.5 hour. The mixture was aged at 80° C. for 2 hours to complete the ring-closing reaction.

Then, sodium chloride produced as a by-product and the unreacted sodium hydroxide were removed by filtration and washing with water, and the water and xylene were evaporated off.

Consequently an epoxy resin (epoxy resin C) was obtained which had an Mn of 1520, an epoxy equivalent of 401, and an average number of functional groups per molecule of 3.8. The equivalent ratio of epoxy group/hydroxyl group was 0.70 and the equivalent ratio of epichlorohydrin/hydroxyl group was 1.2. The weatherability and water resistance of the cured product prepared from this epoxy resin were evaluated and shown in Table 1 below.

In the order contrary to that of Example I-3, 110 g of epichlorohydrin was added dropwise at 100° C. over 0.5 hour to effect a reaction at 100° C. for 1 hour. The addition of 149 g of "Rikaresin HBE-100" was initiated at 100° C., but the mixture gelled when it was added in a total amount of about 50 g.

This phenomenon is presumably attributable to the following. At the time of the gelation, the equivalent ratio of epoxy group/hydroxyl group was about 0.24 and the equivalent ratio of epichlorohydrin/hydroxyl group was 1.2. In this Comparative Example, however, by the earlier addition of epichlorohydrin, the number of moles of the epoxy groups of "Rikaresin HBE-100" exceeded the number of moles of the remaining hydroxyl groups of "Rikabinol HB" which hydroxyl groups were not reacted with epichlorohydrin, whereby the excess epoxy groups were three-dimensionally crosslinked, and caused the gelation.

The weatherability and the resistance to hydrolysis of the cured product prepared from the thus obtained resin were evaluated and shown in Table 1 below.

Curing Conditions of the Epoxy Resin Compositions

The specified epoxy resin composition was applied to a test panel and cured under the conditions of 25° C.×24 hours+80° C.×5 hours.

Weatherability of the Cured Product

A coating film formed on a test panel (steel plate) and having a thickness of 0.7 to 0.8 mm was evaluated in respect of gloss and yellowing using Weather-ometer (manufactured by Kabushiki Kaisha Toyo Seiki Seisakusho) after 1,000 hours of exposure to the condition: a black panel temperature of 63° C. and a relative humidity of 60% while spraying water for 18 minutes every 2 hours.

Resistance to Hydrolysis of the Cured Product

A coating formed on a test panel (glass plate) and having a thickness of 0.7 to 0.8 mm was immersed in a 10% aqueous solution of sodium hydroxide at 25° C. for 1,000 hours and then observed for the condition of the coating film.

TABLE 1

| Formulation | Example | | |
|---|---|---|---|
| (wt. part) | I-1 | I-2 | I-3 |
| Epoxy resin A | 100 | — | — |
| Epoxy resin B | — | 100 | — |
| Epoxy resin C | — | — | 100 |
| N-benzylethylenediamine | 20 | 32 | 24 |
| Rutile type titanium oxide | 30 | 30 | 30 |
| Xylene | 30 | 25 | 30 |
| Weatherability | Good | Goo4 | Good |
| Resistance to hydrolysis | Good | Good | Good |

The epoxy resin prepared by the process according to the present invention is useful for cationic electrophoretic coating compositions, powder coatings, solvent based coating compositions, molding materials, encapsulants, cationic polymerizable resins, cationic polymerizable UV curable resins, stabilizers for polyvinylchloride resins, etc. The epoxy resins of the invention, when used for these materials, exhibit a high operational efficiency and an excellent curability and give cured products superior in weatherability and resistance to hydrolysis.

Such epoxy resins can be commercially produced by the process according to the present invention.

Given below are examples and comparative examples for illustrating the use of the epoxy resins of the present invention for photo-curable resin compositions. The preparation examples illustrate the preparation of the epoxy resins of the invention.

Preparation Example II-1

A reactor equipped with a mechanical stirrer, a decanter and a thermometer was charged with 123 g (0.50 mole) of "Rikabinol HB" and 300 g of xylene, followed by dissolution at 130° C. for 0.5 hour. After the solution was cooled to 100° C., stannic chloride pentahydrate (1.9 g) was added and 55 g (0.60 mole) of epichlorohydrin was added dropwise at 100° C. over 0.5 hour. The mixture was aged at 100° C. for 1 hour. Then, 23 g (0.055 mole) of diglycidyl ether of hydrogenated bisphenol A (trade name "Rikaresin HBE-100", product of new Japan Chemical Co., Ltd.) was added to the reactor at 100° C. over 0.5 hour, and the mixture was reacted at 100° C. for 1.5 hours and then 55 g (0.60 mole) of epichlorohydrin was added dropwise at 100° C. over 0.5 hour. The mixture was aged at 100° C. for 1 hour to complete the addition reaction.

After addition of 1.9 g of benzyltrimethylammonium chloride, 142 g of a 50% aqueous solution of sodium hydroxide was added at 80° C. over 0.5 hour, and the mixture was aged at 80° C. for 5 hours to complete the ring-closing reaction.

Then, sodium chloride produced as a by-product and the unreacted sodium hydroxide were removed by washing with water, and then the water and xylene were evaporated off.

Consequently an epoxy resin (epoxy resin A) was obtained which had an Mn of 542, an epoxy equivalent of 247, and an average number of functional groups per molecule of 2.2. The equivalent ratio of epoxy group/hydroxyl group was 0.11 and the equivalent ratio of epichlorohydrin/hydroxyl group was 1.2.

The epoxy resin obtained above contains a group or groups represented by the foregoing formula (ii), and has a hydroxyl group or a glycidyl group at each terminal.

Preparation Example II-2

A reactor of the same type as used in Preparation Example II-1 was charged with 123 g (0.50 mole) of "Rikabinol HB" and 300 g of xylene, followed by dissolution at 130° C. for 0.5 hour. The solution was cooled to 100° C. Stannic chloride pentahydrate (1.9 g) was added and 55 g (0.60 mole) of epichlorohydrin was added dropwise at 100° C. over 0.5 hour. The mixture was aged at 100° C. for 1 hour. Then, 85 g (0.20 mole) of "Rikaresin HBE-100" was fed to the reactor at 100° C. over, 0.5 hour, and the mixture was reacted at 100° C. for 1.5 hours and then 55 g (0.60 mole) of epichlorohydrin was added dropwise at 100° C. over 0.5 hour. The mixture was aged at 100° C. for 1 hour to complete the addition reaction.

A 1.9 g quantity of benzyltrimethylammonium chloride was added. Then, a 50% aqueous solution of sodium hydroxide (142 g) was added at 80° C. over 0.5 hour, and the mixture was aged at 80° C. for 5 hours to complete the ring-closing reaction.

Then, sodium chloride produced as a by-product and the unreacted sodium hydroxide were removed by washing with water, and then the water and xylene were evaporated off.

Consequently an epoxy resin (epoxy resin B) was obtained which had an Mn of 1010, an epoxy equivalent of 302, and an average number of functional groups per molecule of 3.3. The equivalent ratio of epoxy group/hydroxyl group was 0.40 and the equivalent ratio of epichlorohydrin/hydroxyl group was 1.2.

The epoxy resin obtained in this example contains a group or groups represented by the foregoing formula (ii), and has a hydroxyl group or a glycidyl group at each terminal.

Preparation Example II-3

Into a reactor of the same type as used in Preparation Example II-1 were placed 72 g (0.50 mole) of 1,4-cyclohexanedimethanol (tradename "Rikabinol DM", product of new Japan Chemical Co., Ltd.), 400 g of xylene and 1.7 g of stannic chloride pentahydrate, followed by dissolution at 80° C. for 0.5 hour. After the solution was cooled to 30° C., 160 g (0.38 mole) of "Rikaresin HBE-100" was added thereto and the mixture was heated with stirring to effect reaction at 100° C. for 2 hours. Then, 55 g (0.60 mole) of epichlorohydrin was added dropwise at 100° C. over 0.5 hour, followed by aging at 100° C. for 1 hour, whereby the addition reaction was completed.

Subsequently, after cooling to 80° C., 0.9 g of benzyltrimethylammonium chloride was added, and 24 g of solid sodium hydroxide was added at 80° C. over 0.5 hour, followed by aging at 80° C. for 2 hours to complete the ring-closing reaction.

Then, sodium chloride produced as a by-product and the unreacted sodium hydroxide were removed by washing with water, and then the water and xylene were evaporated off.

Consequently an epoxy resin (epoxy resin C) was obtained which had an Mn of 1910, an epoxy equivalent of 476, and an average number of functional groups per molecule of 4.0. The equivalent ratio of epoxy group/hydroxyl group was 0.75 and the equivalent ratio of epichlorohydrin/hydroxyl group was 0.60.

The epoxy resin obtained in this example contains a group or groups represented by the foregoing formula (i), and has a hydroxyl group or a glycidyl group at each terminal.

Example II-1

Two parts by weight of a cationic photoinitiator ("CIT1682", product of Nippon Soda Kabushiki Kaisha, hereinafter referred to as "photoinitiator A") was dissolved in 100 parts by weight of epoxy resin A to give a photo-curable epoxy resin composition. The photoinitiator A was well dissolved in the resin.

The photo-curable epoxy resin composition was evaluated in respect of the property of set to touch and internal curability by the method to be described later. After the test for the property of set to touch, the coating of the composition was thermally post cured under the condition to be described below, and the cured coating film was evaluated in respect of weatherability, pencil hardness, adhesion, bending resistance and impact resistance by the methods to be described later. The results are shown below in Table 2.

Examples II-2 and 3

Each photo-curable epoxy resin composition was prepared in the same manner as in Example II-1 with the exception of using each of epoxy resins B and C in place of epoxy resin A as shown in Table 2 below. In each of the resin compositions, the photoinitiator was well dissolved.

Each photo-curable epoxy resin composition was evaluated in the same manner as in Example II-1 in respect of the property of set to touch, internal curability, weatherability, pencil hardness, adhesion, bending resistance and impact resistance. The results are shown below in Table 2.

Example II-4

Two parts by weight of triphenylsulfonium hexafluorophosphate as a cationic photoinitiator (50 wt. % propylene carbonate solution, hereinafter referred to as "photoinitiator B") was dissolved in 100 parts by weight of epoxy resin A, giving a photo-curable epoxy resin composition. The photoinitiator was slightly insufficiently dissolved and the composition was slightly turbid.

The photo-curable composition was evaluated in the same manner as in Example II-1 in respect of the property of set to touch, internal curability, weatherability, pencil hardness, adhesion, bending resistance and impact resistance. The results are shown in Table 2.

Example II-5

A photo-curable epoxy resin composition was prepared in the same manner as in Example II-1 with the exception of using a mixture of 85 parts by weight of epoxy resin A and 15 parts by weight of 3,4-epoxycyclohexylmethyl-3',4'-epoxycyclohexanecarboxylate (hereinafter referred to as "epoxy resin D") in place of epoxy resin A. The photoinitiator was well dissolved.

The photo-curable epoxy resin composition was evaluated in the same manner as in Example II-1 in respect of the property of set to touch, internal curability, weatherability, pencil hardness, adhesion, bending resistance and impact resistance. The results are shown below in Table 2.

Example II-6

A photo-curable epoxy resin composition was prepared in the same manner as in Example II-1 with the exception of using a mixture of 50 parts by weight of epoxy resin B and 50 parts by weight of diglycidyl ether of hydrogenated bisphenol A (trade name "Rikaresin HBE-100", product of New Japan Chemical Co., Ltd., hereinafter referred to as "epoxy resin F") in place of epoxy resin A. The photoinitiator was well dissolved.

The photo-curable epoxy resin composition was evaluated in the same manner as in Example II-1 in respect of the property of set to touch, internal curability, weatherability, pencil hardness, adhesion, bending resistance and impact resistance. The results are shown below in Table 2.

Comparative Example II-1

A photo-curable epoxy resin composition was prepared in the same manner as in Example II-1 with the exception of using diglycidyl ether of bisphenol A (hereinafter referred to as "epoxy resin E") in place of epoxy resin A. The photoinitiator was well dissolved.

The photo-curable epoxy resin composition was evaluated in the same manner as in Example II-1 in respect of the property of set to touch, internal curability, weatherability, pencil hardness, adhesion, bending resistance and impact resistance. The results are shown below in Table 2.

Comparative Example II-2

A photo-curable epoxy resin composition was prepared in the same manner as in Example II-1 with the exception of using epoxy resin D in place of epoxy resin A. The photoinitiator was well dissolved.

The composition was evaluated in the same manner as in Example II-1 in respect of the property of set to touch, internal curability, weatherability, pencil hardness, adhesion, bending resistance and impact resistance. The results are shown below in Table 2.

Described below are the conditions for curing the photo-curable epoxy resin compositions obtained above and the methods of evaluating the properties of the compositions.

Conditions for Curing Photo-curable Epoxy Resin Compositions

The specified amount of the cationic photoinitiator was dissolved in 100 parts by weight of the epoxy resin. The solution was applied to a specified test panel to give a coating of 70 $\mu$m thickness. The coating was cured by means of an irradiator for ultraviolet curing (trade name "UE011-227-01", product of Eye Graphics Co., Ltd.) using a high pressure mercury lamp (1 kw/12.5 cm) and a belt conveyor at a radiation distance of 15 cm, while varying the speed of the belt conveyor in such a manner that the composition set to touch by one pass.

Thereafter the coating was post cured in an oven at 100° C. for 1 hour, and evaluated in respect of weatherability, pencil hardness, adhesion, flexing resistance and impact resistance. Used as the test panel were a standard test panel (JIS G-3303 (SPTE)) for evaluating the bending resistance and a standard test panel (JIS G-3141 (SPCC-SB)) for carrying out other tests.

Property of Set to Touch and Internal Curability

The property of set to touch was expressed as a minimum speed of the belt conveyor at which the composition can set to touch by one pass. A film of 70 $\mu$m thickness internally cured was rated as "O" in the degree of internal curing and the film internally uncured with only the surface portion cured was rated as "x".

Weatherability of the Cured Coating Film

A coating film formed on a test panel was exposed for 300 hours by means of Weather-ometer Ci35 (product of ATLAS Electric Devices Co., Ltd.) using a xenon burner (0.39 w/m² at 340 nm) under the conditions of a black panel temperature of 63° C. while sprinkling water for 18 minutes every 2 hours. The weatherability of the film was evaluated by visual observation for yellow discoloration. The absence of yellow discoloration was rated as "O" and the occurrence of yellow discoloration was rated as "x".

Pencil Hardness

Conducted as specified in JIS K-5400. The hardness of the coating film was measured by scratching the coating film with pencils having lead of different hardness and was expressed as the maximum hardness of lead which did not mar the coating surface.

Adhesion (Cross-cut Test)

Conducted as specified in JIS K-5400. A coating film on a test panel was crosswise cut to the substrate to form squares (100 squares, 1 mm×1 mm). An adhesive tape was made to stick on the cross-cut surface and the tape was peeled off. Then the adhesion state was visually observed. The adhesion was rated with 1 to 10 evaluation points. The better the adhesion is, the higher the point is.

Bending Resistance

Conducted as specified in JIS K-5400. Using rods of circular cross section with different radii, a coated test piece was bent around the rod with the coating surface externally directed. Then there was determined the resistance to cracking which occurred due to the difference in the degree of extension between the upper side and underside of the coating film. The bending resistance was expressed in terms of a minimum radius of the rod which did not cause cracking. The smaller the indicated radius of the rod is, the greater the difference in extension is and the higher the bending resistance is.

Impact Resistance (Impact Deformation Test)

Conducted as specified in JIS K-5400. The resistance to the impact caused by a ball of 1/8-inch radius that has collided against the coating film surface to give deformation was evaluated by observing whether cracking or peeling occurred, and was expressed in terms of the maximum height from which a weight weighing 500 g was dropped without causing cracking or peeling. The higher the height is, the greater the impact resistance is.

TABLE 2

|  | Example | | | | | | Comparative Example | |
| --- | --- | --- | --- | --- | --- | --- | --- | --- |
|  | II-1 | II-2 | II-3 | II-4 | II-5 | II-6 | II-1 | II-2 |
| Epoxy resin A | 100 | — | — | 100 | 85 | — | — | — |
| Epoxy resin B | — | 100 | — | — | — | 50 | — | — |
| Epoxy resin C | — | — | 100 | — | — | — | — | — |
| Epoxy resin D | — | — | — | — | 15 | — | — | 100 |
| Epoxy resin E | — | — | — | — | — | — | 100 | — |
| Epoxy resin F | — | — | — | — | — | 50 | — | — |
| Photoinitiator A | 2 | 2 | 2 | — | 2 | 2 | 2 | 2 |
| Photoinitiator B | — | — | — | 2 | — | — | — | — |
| Property of set to touch (m/min) | 2.5 | 3 | 3 | 2 | 4 | 3 | 1.5 | 5 |
| Internal curability | O | O | O | O | O | O | X | X |
| Pencil hardness | H | 2H | H | H | 2H | 2H | H | 4H |
| Adhesion (point) | 10 | 10 | 10 | 10 | 6 | 10 | 2 | 0 |
| Bending resistance (mm φ) | <2 | <2 | <2 | <2 | 4 | <2 | 4 | >10 |
| Impact resistance (cm) | >500 | >500 | >500 | >500 | 200 | >500 | <50 | <50 |
| Weatherability | O | O | O | O | O | O | X | O |

The photo-curable epoxy resin composition of the present invention is excellent in weatherability, rapidly photo-cured, uniformly curable through a thick coating, free from inhibition by oxygen of surface hardening, and capable of giving cured coating films excellent in adhesion, flexibility, impact resistance, etc. and low in toxicity and skin irritation. Thus the composition of the invention is useful as coating materials such as gloss varnish for plastics, metals and the like or as a photo-curable resin composition for paints, adhesives, printing inks, photo-resists, encapsulants, plate materials for printing, etc.

Examples are given below to illustrate the use of the present epoxy resin for powder coatings. Preparation Examples are described to illustrate the preparation of the epoxy resin of the invention and the preparation of polyester resins for use in combination with the epoxy resin of the invention.

Preparation Example III-1

A 1-liter, 4-necked flask equipped with a stirrer, a decanter and a thermometer was charged with 123 g (0.50 mole) of hydrogenated bisphenol A (trade name "Rikabinol HB", product of New Japan Chemical Co., Ltd.) and 300 g of xylene, followed by dissolution at 130° C. Then, 1.9 g of stannic chloride pentahydrate was added at 100° C. A 55 g (0.60 mole) quantity of epichlorohydrin was added dropwise over 0.5 hour, followed by aging for 1 hour. A 85 g (0.20 mole) quantity of diglycidyl ether of hydrogenated bisphenol A (Trade name "Rikaresin HBE-100", product of New Japan Chemical Co., Ltd.) was added over 0.5 hour to effect a reaction for 1.5 hours. Then 55 g (0.60 mole) of epichlorohydrin was added dropwise at 100° C. over 0.5 hour, followed by aging for 1 hour to complete the addition reaction.

Subsequently 1.9 g of benzyltrimethylammonium chloride was added at 80° C. and 142 g of a 50% aqueous solution of sodium hydroxide was added over 0.5 hour, followed by aging for 5 hours to complete the ring-closing reaction. Sodium chloride produced as a byproduct and the unreacted sodium hydroxide were removed by washing with water, and then the water and xylene were evaporated off.

Consequently an epoxy resin (epoxy resin A) was obtained which had an Mn of 1010, an epoxy equivalent of 302, and an average number of functional groups per molecule of 3.3. The equivalent ratio of epoxy group/hydroxyl group was 0.40 and the equivalent ratio of epichlorohydrin/hydroxyl group was 1.2.

The epoxy resin obtained in this example contains a group or groups represented by the foregoing formula (ii), and has a hydroxyl group or a glycidyl group at each terminal.

Preparation Example III-2

Into a reactor of the same type as used in Preparation Example III-1 were placed 72 g (0.50 mole) of 1,4-cyclohexanedimethanol (trade name "Rikabinol DM", product of New Japan Chemical Co., Ltd.), 400 g of xylene and 1.7 g of stannic chloride pentahydrate, followed by dissolution at 80° C. The solution was cooled to 30° C. and 160 g (0.38 mole) of "Rikaresin HBE-100" was added. The mixture was heated with stirring to effect a reaction at 100° C. for 2 hours. Then a 55 g (0.60 mole) quantity of epichlorohydrin was added dropwise at 100° C. over 0.5 hour, followed by aging for 1 hour to complete the addition reaction.

Then, the reaction mixture was cooled to 80° C. and 0.9 g of benzyltrimethylammonium chloride was added. A 24 g quantity of solid sodium hydroxide was added at 80° C. over 0.5 hour, followed by aging at 80° C. for 2 hours to complete the ring-closing reaction. Sodium chloride produced as a by-product and the unreacted sodium hydroxide were removed by filtration and washing with water, and then the water and xylene were evaporated.

Consequently an epoxy resin (epoxy resin B) was obtained which had an Mn of 1910, an epoxy equivalent of 476, and an average number of functional groups per molecule of 4.0. The equivalent ratio of epoxy group/hydroxyl group was 0.75 and the equivalent ratio of epichlorohydrin/hydroxyl group was 0.60.

The epoxy resin obtained in this example contains a group or groups represented by the foregoing formula (i), and has a hydroxyl group or a glycidyl group at each terminal.

Preparation Example III-3

Into a reactor of the type used in Preparation Example III-1 were placed 123 g (0.50 mole) of "Rikabinol HB" and 300 g of diethylene glycol dimethyl ether, followed by dissolution at 110° C. The solution was cooled to 100° C. and 1.9 g of stannic chloride pentahydrate was added. A 152 g (0.36 mole) quantity of "Rikaresin HBE-100" was added over 1 hour to effect a reaction for 0.5 hour. A 30 g (0.32 mole) quantity of epichlorohydrin was added dropwise at 100° C. over 0.5 hour, followed by aging for 1 hour to complete the addition reaction.

Then, the diethylene glycol dimethyl ether was distilled off at 100° C. under reduced pressure. A 500 g quantity of xylene and 0.7 g of benzyltrimethylammonium chloride were added, and then 13 g of solid sodium hydroxide was added at 80° C. over 0.5 hour, followed by aging for 2 hours to complete the ring-closing reaction.

Then, sodium chloride produced as a by-product and the unreacted sodium hydroxide were removed by filtration and washing with water. Then the water and xylene were evaporated off.

Consequently an epoxy resin (epoxy resin C) was obtained which had an Mn of 1860, an epoxy equivalent of 890, and an average number of functional groups per molecule of 2.1. The equivalent ratio of epoxy group/hydroxyl group was 0.72 and the equivalent ratio of epichlorohydrin/hydroxyl group was 0.32.

The epoxy resin obtained in this example contains a group or groups represented by the foregoing formula (ii), and has a hydroxyl group or a glycidyl group at each terminal.

Preparation Example III-4

Into a reactor of the same type as used in Preparation Example III-1 were placed 100 g (0.60 mole) of terephthalic acid, 86 g (0.50 mole) of hexahydroterephthalic acid, 99 g (0.95 mole) of neopentyl glycol, 7 g (0.05 mole) of trimethylolpropane, 0.3 g of dioctyltin oxide as a catalyst and 1.0 g of xylene. The reaction was carried out by gradually heating the mixture from 160° C. to 250° C., while removing water as an azeotrope with xylene at atmospheric pressure in a nitrogen gas stream for 10 hours. The pressure was reduced to 5 mmHg at 250° C. to remove the xylene, giving a polyester resin (polyester resin A) having an acid value of 34 and a melt temperature of 116° C.

Preparation Example III-5

Into a reactor of the same type as used in Preparation Example III-1 were placed 83 g (0.50 mole) of terephthalic acid, 120 g (0.70 mole) of hexahydrophthalic acid, 99 g (0.95 mole) of neopentyl glycol, 10 g (0.07 mole) of trimethylolpropane, 0.3 g of dioctyltin oxide as a catalyst and 1.0 g of xylene. The reaction was carried out by gradually heating the mixture from 160° C. to 250° C., while removing water as an azeotrope with xylene at atmospheric pressure in a nitrogen gas stream for 8 hours. The pressure was reduced to 5 mmHg at 250° C. to remove the xylene, giving a polyester resin (polyester resin B) having an acid value of 61 and a melt temperature of 98° C.

Example III-1

A resin composition for powder coating was prepared using a mixture of 84 parts by weight of "polyester resin A", 16 parts by weight of "epoxy resin A", 0.2 part by weight of "Curezole $C_{11}Z$" (2-undecylimidazole, trade name, product of Shikoku Chemicals Corp.), 0.5 part by weight of "Modaflow Mark 2" (trade name, product of Monsanto Co., Ltd.) as a flowability adjusting agent and 30 parts by weight of rutile type titanium oxide. The mixture was melted and kneaded at 130° C. After cooling, the mixture was pulverized by a grinder and the obtained particles were passed through a 100-mesh sieve to provide a resin composition for powder coating.

The cured coating films of the composition thus obtained were evaluated in respect of pencil scratch hardness, adhesion, water resistance, impact resistance, and weatherability. The results are shown in Table 3.

Examples III-2 and 3

Each resin composition for powder coatings was prepared in the same manner as in Example III-1 with the exception of using the specified epoxy resin in place of "epoxy resin A".

Table 3 below shows the evaluation results of the cured coating films of the compositions in respect of pencil scratch hardness, adhesion, water resistance, impact resistance and weatherability.

Example III-4

A resin composition for powder coatings was prepared in the same manner as in Example III-3 with the exception of using "polyester resin B" in place of "polyester resin A".

Table 3 below shows the evaluation results of the cured coating films of the compositions in respect of pencil scratch hardness, adhesion, water resistance, impact resistance and weatherability.

Comparative Example III-1

A resin composition for powder coatings was prepared in the same manner as in Example III-4 with the exception of using glycidyl ether of bisphenol A (epoxy resin D) having an Mn of 1820, an epoxy equivalent of 910 and an average number of functional groups per molecule of 2.0 in place of "epoxy resin C".

Table 3 below shows the evaluation results of the cured coating films of the compositions in respect of pencil scratch hardness, adhesion, water resistance, impact resistance and weatherability.

Described below are the conditions for curing said resin compositions for powder coatings and the methods of evaluating the properties of the compositions.

Conditions for Curing Resin Compositions for Powder Coatings

The resin compositions for powder coatings were electrostatically applied to a standard test panel (JIS G-3141 (SPCC-SB), product of Nippon Test Panel Osaka Kabushiki Kaisha) to a thickness of 70 to 90 μm, and the resulting coating was baked at 180° C. for 30 minutes, whereby the coating was cured.

Weatherability

A cured film formed was exposed for 300 hours using Weather-ometer Ci35 (trade name, product of ATLAS Electric Devices Co., Ltd.) under the conditions that a xenon burner was used on 0.39 W/m² (at 340 nm) black panel temperature was 63° C. and water was sprinkled for 18 minutes every 2 hours. Thereafter, the cured film was visually observed for gloss and discoloration. The decrease in gloss and the occurrence of yellow discoloration were rated as "x" and the non-occurrence of such abnormalities were rated as "O".

Pencil Scratch Value

Conducted as specified in JIS K-5400. The pencil scratch resistance of coating was measured by scratching the coating film with pencils and was expressed in terms of maximum hardness of lead which did not mar the coating film surface.

Adhesion (Cross-cut Test)

Conducted as specified in JIS K-5400. A coating on a test panel was crosswise cut to the substrate to form squares (100 squares, 1 mm×1 mm). An adhesive tape was made to stick on the cross-cut coating and the tape was peeled off. Then the adhering state of the coating was visually inspected. The adhesion was rated with 1 to 10 points. The better the adhesion is, the higher the point is.

Water Resistance

A test panel having a cured coating film was immersed in distilled water at 40° C. for 7 days and checked for adhesion (cross-cut test).

Impact Resistance (Du Pont Method)

Conducted as specified in JIS K-5400. A ball of ⅛-inch radius was contacted with the coating film surface. A weight weighing 500 g was dropped from a height onto the ball. The impact resistance was expressed as maximum height which did not cause cracking or peeling. The higher the height is, the greater the impact resistance is.

TABLE 3

| | Example | | | | Comparative Example |
|---|---|---|---|---|---|
| | III-1 | III-2 | III-3 | III-4 | III-1 |
| Polyester resin A | 84 | 78 | 65 | — | — |
| Polyester resin B | — | — | — | 50 | 50 |
| Epoxy resin A | 16 | — | — | — | — |
| Epoxy resin B | — | 22 | — | — | — |
| Epoxy resin C | — | — | 35 | 50 | — |
| Epoxy resin D | — | — | — | — | 50 |
| Curezole $C_{11}Z$ | 0.2 | 0.2 | 0.2 | 0.2 | 0.2 |
| Modaflow Mark 2 | 0.5 | 0.5 | 0.5 | 0.5 | 0.5 |
| Rutile type titanium oxide | 30 | 30 | 30 | 30 | 30 |
| Pencil scratch value | >7H | 6H | 5H | 6H | 6H |
| Adhesion (point) | 10 | 10 | 10 | 10 | 7 |
| Water resistance (point) | 9 | 8 | 6 | 7 | 2 |
| Impact resistance (mm) | 400 | >500 | >500 | >500 | 300 |
| Weatherability | O | O | O | O | X |

The resin composition for powder coatings according to the invention is low in toxicity and skin irritation, outstanding in weatherability, free of evaporation of volatile components during baking and is capable of giving cured coating films having excellent film properties such as appearance, adhesion, strength, impact resistance, water resistance and the like. The resin composition of the invention is useful for powder coatings for coating construction materials, traffic-related articles, vehicle-related products, steel furniture, light electrical appliances, etc. which are prone to exposure to outdoor light rays and like ultraviolet rays.

We claim:

1. An epoxy resin which contains a group or groups represented by the formula (1), and which has a number average molecular weight of 400 to 10,000, an epoxy equivalent of 100 to 5,000 and an average number of glycidyl ether groups per molecule of 2 to 50

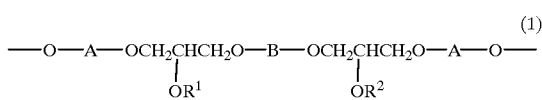

wherein A is a group represented by the formula (2)

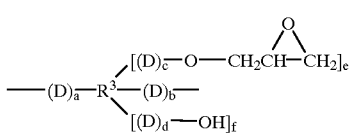

(wherein $R^3$ represents a straight-chain or branched-chain saturated aliphatic polyhydric alcohol residue having 2 to 30 carbon atoms which has at least one cyclohexylene group, D represents an oxyalkylene group having 2 or 3 carbon atoms, a, b, c and d each represents an integer of 0 to 25, e and f each represents an integer of 0 to 4, e+f is equal to an integer of 0 to 4 and a+b+c×e+d×f is equal to an integer of 0 to 50), and B is a group represented by the formula (3)

(wherein R⁴ is a group

—CH₂—[cyclohexylene]—CH₂—, a group

[cyclohexylene]—CH₂—[cyclohexylene]— or a group

[cyclohexylene]—C(CH₃)₂—[cyclohexylene]—,

D has the same meaning as in the formula (2), and g and h each represents an integer of 0 to 18), and R¹ and R² are the same or different and each represents a hydrogen atom, a glycidyl group or a group represented by the formula (pp)

$$\text{—OCH}_2\text{CHCH}_2\text{O—B—OCH}_2\text{CHCH}_2\text{O—A—OR}^7 \quad (pp)$$
$$\qquad\quad |\qquad\qquad\qquad |$$
$$\qquad\ \ \text{OR}^8\qquad\qquad\quad\text{OR}^8$$

(wherein A and B have the same meaning as above, and R⁷, R⁸ and R⁹ are the same or different and each represents a hydrogen atom or a glycidyl group).

2. An epoxy resin according to claim 1 wherein R³ in the formula (2) is a straight-chain or branched-chain saturated aliphatic polyhydric alcohol residue of 2 to 30 carbon atoms which has 1 or 2 cyclohexylene groups.

3. An epoxy resin according to claim 2 wherein a, b, c and d in the formula (2) all represent 0, and g and h in the formula (3) represent 0.

4. An epoxy resin according to claim 1 wherein A and B in the formula (1) are the same or different and each represents —CH₂—[cyclohexylene]—CH₂— or

[cyclohexylene]—C(CH₃)₂—[cyclohexylene]— .

5. An epoxy resin according to claim 1 wherein A and B in the formula (1) each represents

[cyclohexylene]—C(CH₃)₂—[cyclohexylene]— .

6. An epoxy resin according to claim 1 wherein R³ in formula (2) is a group represented by the formula:

—CH₂—[cyclohexylene]—CH₂— (2-1)

or

[cyclohexylene]—C(CH₃)₂—[cyclohexylene]— (2-2)

7. An epoxy resin according to claim 1 wherein R³ in the formula (2) is a group represented by the formula:

[cyclohexylene]—C(CH₃)₂—[cyclohexylene]— (2-2)

8. An epoxy resin according to claim 1 which has an epoxy equivalent of 130 to 5,000.

9. An epoxy resin according to claim 3 which has a number average molecular weight of 500 to 10,000 and an epoxy equivalent of 200 to 5,000.

10. An epoxy resin according to claim 4 which has a number average molecular weight of 500 to 10,000 and an epoxy equivalent of 200 to 5,000.

11. An epoxy resin according to claim 5 which has a number average molecular weight of 500 to 10,000 and an epoxy equivalent of 200 to 5,000.

12. A process for preparing an epoxy resin which has a number average molecular weight of 400 to 10,000, an epoxy equivalent of 100 to 5,000 and an average number of glycidyl ether groups per molecule of 2 to 50, the process comprising (a) the steps of subjecting
  (i) a polyol represented by the formula (4)

$$\text{HO—(D)}_a\text{—R}^3\begin{matrix}\nearrow[(D)_c\text{—OH}]_e\\ \text{—(D)}_b\text{—OH}\\ \searrow[(D)_d\text{—OH}]_f\end{matrix} \quad (4)$$

wherein R³ is a straight-chain or branched-chain saturated aliphatic polyhydric alcohol residue having 2 to 30 carbon atoms which has at least one cyclohexylene group, D is an oxyalkylene group having 2 or 3 carbon atoms, a, b, c and d each represents an integer of 0 to 25, e and f each represents an integer of 0 to 4, e+f is equal to an integer of 0 to 4 and a+b+c×e+d×f is equal to an integer of 0 to 50, (ii) an epihalohydrin, and
(iii) a diglycidyl ether represented by the formula (5)

$$\underset{CH_2CHCH_2O}{\overset{O}{\triangle}}\text{—(D)}_g\text{—R}^4\text{—(D)}_h\text{—OCH}_2\underset{CH}{\overset{O}{\triangle}}CH_2 \quad (5)$$

wherein $R^4$ is a group

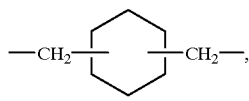, a group

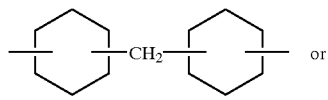 or a group

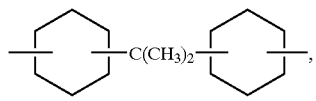,

D is an oxyalkylene group having 2 or 3 carbon atoms and g and h each represents an integer of 0 to 18 to addition reaction in the presence of a Lewis acid to give an addition reaction product, and (b) subjecting the obtained addition reaction product to ring-closing reaction in the presence of a basic compound.

13. A process according to claim 10 wherein the polyol of the formula (4) is one in which $R^3$ is a straight-chain or branched-chain saturated aliphatic polyhydric alcohol residue having 2 to 30 carbon atoms which has 1 or 2 cyclohexylene groups.

14. A process according to claim 10 wherein a, b, c and d in the formula (4) all represent 0, and g and h in the formula (5) represent 0.

15. A process according to claim 10 wherein the polyol of the formula (4) is at least one member selected from the group consisting of hydrogenated bisphenol A and cyclohexanedimethanol, and the diglycidyl ether of the formula (5) is diglycidyl ether of hydrogenated bisphenol A or diglycidyl ether of cyclohexanedimethanol.

16. A process according to claim 10 wherein the polyol of the formula (4) is hydrogenated bisphenol A, and the diglycidyl ether of the formula (5) is diglycidyl ether of hydrogenated bisphenol A.

17. A process according to claim 12 wherein the polyol of the formula (4) is one in which $R^3$ is a group represented by the formula:

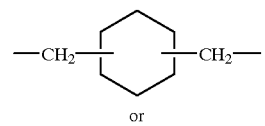

(2-1)

or

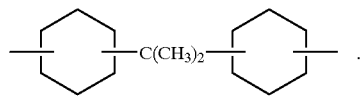

(2-2)

18. A process according to claim 12 wherein the polyol of the formula (4) is one in which $R^3$ is a group represented by the formula:

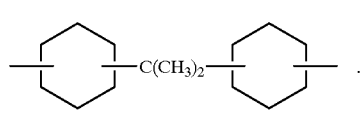

(2-2)

19. A process according to claim 10 characterized in that in the addition reaction step, the equivalent ratio of the epoxy groups of the diglycidyl ether of the formula (5) to the hydroxyl groups of the polyol of the formula (4) is at least 0.01 to less than 1, at least 70% of the diglycidyl ether of the formula (5) has been consumed in the addition reaction, the equivalent ratio of the epihalohydrin to the hydroxyl groups of the polyol of the formula (4) is 0.1 to 2, and in the ring-closing reaction step, the amount of the basic compound is about 1.0 to about 2.0 equivalents based on the hydrolyzable halogen of the addition reaction product.

* * * * *